US 6,727,643 B2

(12) United States Patent
Suehiro

(10) Patent No.: US 6,727,643 B2
(45) Date of Patent: Apr. 27, 2004

(54) REFLECTIVE LIGHT EMITTING DIODE, REFLECTIVE OPTICAL DEVICE AND ITS MANUFACTURING METHOD

(75) Inventor: Yoshinobu Suehiro, Nishikasugai-gun (JP)

(73) Assignee: Toyoda Gosei Co., Ltd., Aicki-ken (JP)

( * ) Notice: Subject to any disclaimer, the term of this patent is extended or adjusted under 35 U.S.C. 154(b) by 67 days.

(21) Appl. No.: 10/056,047

(22) Filed: Jan. 28, 2002

(65) Prior Publication Data

US 2002/0101157 A1 Aug. 1, 2002

(30) Foreign Application Priority Data

Jan. 26, 2001 (JP) ........................ 2001-019140
Jun. 27, 2001 (JP) ........................ 2001-194598
Jun. 28, 2001 (JP) ........................ 2001-196559

(51) Int. Cl.⁷ ................................. H01J 1/62
(52) U.S. Cl. .............. 313/499; 313/110; 313/113; 257/98; 257/100
(58) Field of Search ................. 313/110, 113, 313/499, 512; 362/84, 347, 800; 359/894, 534; 257/98, 100, 788

(56) References Cited

U.S. PATENT DOCUMENTS 5,486,946 A * 1/1996 Jachimowicz et al. ...... 359/263
5,782,553 A * 7/1998 McDermott .................. 362/245
5,965,529 A * 10/1999 Garfield et al. ............... 514/12
5,998,925 A * 12/1999 Shimizu et al. .............. 313/503
6,069,440 A * 5/2000 Shimizu et al. .............. 313/486
6,614,179 B1 * 9/2003 Shimizu et al. .............. 313/512

FOREIGN PATENT DOCUMENTS

JP          10-144966          5/1998

* cited by examiner

Primary Examiner—Don Wong
Assistant Examiner—Thuy Vinh Tran
(74) Attorney, Agent, or Firm—McGinn & Gibb, PLLC

(57) ABSTRACT

A reflective light emitting diode (LED) has a pair of leads for supplying an electric power to an LED element. The LED element is mounted on a lower surface of one of the leads. A wire bonds the other lead and the LED element to connect them electrically. An aluminum plate is pressed to form a reflection mirror of concave shape. The reflection mirror is attached to the leads. An encapsulating resin encapsulates the leads and the reflection mirror. At the same time, a flat shape of a radiation portion is molded at a back of the LED element. The lead on which the LED element is mounted is disposed near a flat marginal portion of the reflection mirror with an insulating sheet material having a ring shape of 0.1 mm thick.

27 Claims, 21 Drawing Sheets

REFLECTIVE LIGHT EMITTING DIODE, REFLECTIVE OPTICAL DEVICE AND ITS MANUFACTURING METHOD

BACKGROUND OF THE INVENTION

1. Field of the Invention

This invention relates to a reflective light emitting diode (LED) having a reflective surface that reflects the light emitted from a reflective optical device, namely an LED element, thereby obtaining high external radiation efficiency. The invention also relates to a photodetector such as a reflective photodiode or a reflective phototransistor having a reflective surface that condenses and receives the light entering from an outside, thereby obtaining high photo-detecting rate. The invention also relates to a reflective photo-detecting/light-emitting device or the like having a pair of the LED and the photodetector. Hereafter, the reflective light emitting diode is referred to simply as "reflective LED." The reflective photodiode is referred to simply as "reflective PD." The reflective phototransistor is referred to simply as "reflective PT."

In the specification, the LED chip itself is referred to as "LED element," while an entire light emitting device including a sealing resin to mount an LED chip and an optical device such as a lens system, is referred to as "light emitting diode" or "LED." In the same manner, the PD chip or PT chip itself is referred to as "photo-detecting element," while an entire photo-detecting device including a sealing resin to mount a PD chip or PT chip and an optical device such as a lens system, is referred to as "photodiode" or "PD" or "phototransistor" or "PT." The LED element, the photo-detecting element and the photo-detecting/light-emitting element combining them are referred to as "solid-state optical element."

2. Description of the Related Art

A reflective light emitting diode (reflective LED) is known conventionally. The reflective LED has a lead mounting an LED element thereon. The lead and the LED element is sealed with a synthetic resin. A reflective surface shape is formed by molding at a light-emitting surface side of the LED element, while a radiation surface shape is formed by molding at a rear surface side of the LED element. Then, a reflective mirror is formed by evaporation of a metal such as a silver on a synthetic resin surface of the reflective surface shape.

As an example of such reflective LED, an LED is shown in FIG. 35 and FIG. 36 which is disclosed in Japanese Laid Open Patent Publication (Kokai) 10-144966. FIG. 35 is a plan view of an entire configuration of a conventional reflective LED. FIG. 36 is a cross-section taken along the line XXXVI—XXXVI of FIG. 35.

As shown in FIG. 35 and FIG. 36, a reflective LED 331 has a pair of leads 333a and 333b. An LED element 332 is mounted on a lower surface of the one lead 333a. A wire 334 bonds and electrically connects the other lead 333b and the LED element 332. Thus structured lead portion is encapsulated by a transparent epoxy resin 336 to form a molded shape. The molded shape has a radiation surface shape 336a at a rear surface side of the LED element 332 and a reflection surface shape 336b at a light emitting surface side of the LED element 332. A silver is vapor-deposited on the reflection surface shape 336b to form a reflection mirror 335.

In such structure of the reflective LED 331, external radiant efficiency does not decrease as in a lens LED even if a light-condensing rate is increased. The LED 331 can obtain high external radiation property, which does not depend on light distribution property, by the reflection mirror 335 having a solid angle of about $2\pi$ steradian in relation to the LED element 332. Therefore, the LED 331 has less dislocation of an axis and is particularly suitable for light-condensation/external-radiation. Moreover, the upper and lower optical surfaces can be easily shaped at the same time by a transfer mold. Therefore, the LED 331 is suitable for mass production, too. There have been many propositions about a structure of the reflective LED. Still, it is only such transfer molding type LED that can be mass-produced and that are actually supplied to a market.

However, the reflective LED 331 is adversely affected by temperature change, since coefficient of thermal expansion is very much different between the sealing resin and the vapor-deposited metal. Moreover, the LED 331 is structurally weak and subject to separation or delamination. Then, the metal material of the reflection mirror 335 may be peeled off from the sealing resin 336, thereby causing wrinkles on the reflection surface. Thus, the LED loses a function of the reflection mirror. Therefore, the LED 331 cannot deal with a process in a reflow furnace or the like for mounting substrates in which large temperature change takes place. Thus, there is a problem that the LED 331 cannot be surface-mounted.

Furthermore, as shown in FIG. 35, lead extracting portions 337a, 337b of 1 to 1.5 mm long must be formed on the sealing resin 335 for providing a masking space to prevent short-circuit of the leads 333a, 333b at the time of vapor-deposition of the metal and for reinforcement of end portions at the time of perpendicularly bending the leads 333a, 333b. Therefore, a package of the reflective LED 331 needs extra dimension of 2 to 3 mm. Consequently, another problem arises that there is a limit in miniaturization and high-density mounting.

In addition, the LED requires higher heat radiation property. This is because, in general, if temperature of the LED element increases, a light output of the LED element decreases, and its life property deteriorates, too. Particularly, in case large current is conducted to the LED element, an active heat radiation property is needed. Therefore, the heat radiation property has been insufficient in the conventional reflective LED that has such a structure as the LED 331.

The reflective LED 331 by the transfer molding uses a synthetic resin having large fluidity. Therefore, a metal mold requires high accuracy and it has been difficult to fabricate the metal mold. Moreover, it has been necessary to fabricate a metal mold for each of LEDs having different specification of light distribution. Furthermore, there is a problem that a kind of usable sealing resin is limited and that the sealing resin is easily yellowed thereby shortening the life particularly of a blue LED.

BRIEF SUMMARY OF THE INVENTION

An object of the present invention is to provide a reflective optical device that has durability against a temperature change, that is easy to be miniatured and that is excellent in heat radiation.

Another object of the present invention is to provide a reflective optical device such as a reflective LED and its manufacturing method that has high light condensation/radiation efficiency and little dislocation of an axis, that has durability against a temperature change, that has many choices of encapsulating materials to be used and that is excellent in mass-productivity.

Still another object of the present invention is to provide a reflective optical device such as a reflective LED and its manufacturing method that has high light condensation/radiation efficiency and little dislocation of an axis, that has durability against a temperature change and a physical contact so as to be surface-mounted, that is easy to be miniatured, that can change a light distribution without a new metal mold and that is excellent in mass-productivity.

According to a first aspect of the invention, there is provided a reflective light emitting diode (LED). The LED comprises: an LED element; a pair of leads for supplying an electric power to the LED element; a reflection mirror of concave shape facing a light emitting side of the LED element; and a radiation portion provided at a back side of the LED element. The LED element is mounted on one of the leads. The one of the leads is contacted with or disposed near the reflection mirror. At least one of the leads is insulated from the reflection mirror. The pair of the leads and the reflection mirror are made of a material having a high heat conductivity, respectively, so as to have a sufficient heat capacity for diffusing heat radiated from the LED element.

With the reflective LED having such features, the one lead on which the LED element is mounted is contacted with or disposed near the reflection mirror. Therefore, the heat of the LED element conducts from the one lead, which is made of the material having high heat-conductivity and which has a sufficient heat capacity for diffusing the heat radiated from the LED element, to the reflection mirror, which is made of the material having high heat-conductivity and which has a sufficient heat capacity for diffusing the heat radiated from the LED element. Consequently, the heat is radiated from the entire reflection mirror. As a result, the LED has a very high heat radiation. Since one or both of the one lead and the other lead is insulated from the reflection mirror, there is no possibility that the one lead and the other lead are short-circuited via the reflection mirror.

The reflection mirror of concave shape that faces the light emitting side of the LED element has high reflectance and high external radiation efficiency. The reflection mirror has many choices in design of light radiation property such as light distribution property. Therefore, the LED can realize high light intensity.

Since the reflection surface is made of the material having high heat-conductivity, it has durability against a temperature change and does not lose its function as the reflection mirror due to generation of wrinkles caused by the temperature change that has been found in a reflection mirror having a metal vapor-deposited on a resin surface. Therefore, the LED can be processed in a reflow furnace for surface mounting and can be used as surface mounting parts without any limits. Consequently, the LED is suitable as reflective LEDs that are mounted in a great amount. Moreover, in such structure of the reflective LED, it is unnecessary to provide an extra space for lead extracting portions, so that the LED is suitable for miniaturization, too.

A reflective LED may further comprise a light transmitting material for encapsulation. The light transmitting material encapsulates the LED element, part of the pair of the leads and the reflection mirror by molding so as to form the reflection portion.

With the reflective LED having such features, the LED element is encapsulated by the light transmitting material. Therefore, a light output from the LED element becomes twice as large as one that outputs the light directly to the air. Consequently, the LED can enlarge quantity of light of the external radiation. Since the LED element is encapsulated, it is prevented from degradation due to moisture. Therefore, the LED has high reliability. The radiation portion is made by molding while the LED element, part of the leads and the reflection mirror are encapsulated by the light transmitting material. Therefore, a surface roughness of the radiation portion becomes an optical level by mirror-polishing an inner wall surface of an encapsulating mold and is formed as an optical surface. Consequently, there is no scattering at an interface of the radiation portion. The light reflected at the reflection mirror is radiated from the radiation portion as it is with high external radiation efficiency.

Moreover, a final step is only a step for setting the members in the metal mold and encapsulating them by the resin. Therefore, the LED can be easily manufactured by use of existing production machines. Consequently, mass-production of the reflective LED is achieved.

A reflective LED may further comprise a heat-conducting portion formed at a border portion of the reflection mirror so as to conduct heat from the one of the leads.

If the heat-conducting portion is formed at the border portion of the reflection mirror, a contacted or a faced area of the one lead with the LED element mounted relative to the reflection mirror increases. Therefore, the heat of the LED element can be conducted to the reflection mirror more effectively via the one lead. Consequently, the LED becomes a reflective LED that is more excellent in the heat conductivity.

In a reflective LED, the heat-conducting portion may comprise a flat marginal portion of a ring shape integrally formed along an outer circumferential edge of the reflection mirror so as to protrude outward in a flange shape.

In a reflective LED, the heat-conducting portion may comprise protrusions of a flat plate shape protruding outward only from positions corresponding to the leads in an outer circumferential edge of the reflection mirror.

In a reflective LED, the pair of the leads and the reflection mirror may be made of a metal plate, respectively.

The metal plate has high heat conductivity and excellent workability. Therefore, it is possible to easily fabricate the reflection mirror of concave shape. Since the heat of the LED element is conducted from the one lead to the reflection mirror both made of the metal plate, the heat can be radiated from the entire reflection mirror. Therefore, the LED becomes a reflective LED that is very excellent in heat radiation.

In a reflective LED, the reflection mirror may be made of an aluminum plate.

The aluminum plate is a material that is easy to be pressed. Therefore, it is possible to easily fabricate the reflection mirror by pressing. Moreover, it is possible to easily obtain aluminum plate having very high linear reflectance. Therefore, it is possible to easily fabricate the reflection mirror having high reflectance. Since the aluminum plate has high heat conductivity, the heat of the LED element is conducted from the one lead to the reflection mirror both made of the aluminum plate, so that the heat can be radiated from the entire reflection mirror. Therefore, the LED becomes a reflective LED that is very excellent in heat radiation. Moreover, the aluminum has high reflectance in a wavelength zone from a visible light to an ultraviolet light. Therefore, if it is made into the reflection mirror, there is no need for plating treatment. Particularly, in case an ultraviolet LED element is used as the LED element, the silver has very low reflectance in a zone of the ultraviolet rays. Therefore, the reflection mirror of the aluminum plate can obtain high reflectance for the ultraviolet rays that cannot be obtained by the widely used silver plating.

In a reflective LED, the pair of the leads may be disposed near the reflection mirror. The reflective LED further comprises an insulating sheet material having a ring shape corresponding to the flat marginal portion of the reflection mirror and interposed between the pair of the leads and the flat marginal portion of the reflection mirror so as to insulate the pair of the leads and the reflection mirror, respectively.

In a reflective LED, the one of the leads may be contacted with the reflection mirror. The other of the leads is disposed away from the reflection mirror via one of a cut-away portion formed at a position of the reflection mirror facing the other of the lead, a dent formed at a position of the reflection mirror facing the other of the lead and a bridging portion formed at a position of the reflection mirror facing the other of the lead, so that the other of the leads is insulated from the reflection mirror.

In a reflective LED, the reflection mirror may have a light transmitting insulating treatment provided on a surface and the pair of the leads are contacted with the reflection mirror.

Specifically, in the reflective LED of the invention, the reflection mirror is provided with the light transmitting insulating treatment (oxidation treatment) on the surface of the metal plate. The surface of the reflection mirror can be given insulation without decreasing the reflectance of the reflection mirror by forming the insulating metallic oxide on the surface. Therefore, even if the one lead and the other lead are both contacted with the reflection mirror, the one lead and the other lead are never short-circuited. Consequently, fabrication of the reflective LED using the metal reflection mirror becomes easy. Moreover, the one lead can be contacted with the reflection mirror, so that the heat conductivity improves and the LED becomes more excellent in the hear radiation.

In a reflective LED, the pair of the leads may be contacted with an outer circumferential edge of the reflection mirror. The radiation portion is made of a glass plate covering an entire opening of the reflection mirror from an outside of the pair of the leads. The reflection mirror has hooking claws at the outer circumferential edge so as to hook an outer surface of an outer circumferential edge portion of the reflection mirror through the hooking claws, thereby holding and assembling the pair of the leads between the outer circumferential edge and the glass plate.

In a reflective LED, the reflection mirror may have a reflection surface formed on an alumina and a reflection layer vapor-deposited on the reflection surface so as to have a hollow inside space. The reflection mirror has recesses formed on an outer circumference for accommodating the pair of the leads. The pair of the leads are fitted in the recesses of the reflection mirror, respectively, and at least the one of the leads is contacted with the reflection mirror via the dent.

According to a second aspect of the invention, there is provided a reflective optical device comprising: a solid-state optical element, a lead, an encapsulating material and a reflection member. The solid-state optical element is mounted on the lead. The reflection member has a reflection mirror formed thereon. The reflection mirror is disposed at a position facing the solid-state optical element. The encapsulating material encapsulates the solid-state optical element, part of the lead and the reflection mirror so that a light radiation surface and/or a light incident surface is formed at a back of the solid-state optical element. The lead is extracted from one side of the encapsulating material to define an external terminal.

With the reflective optical device having such structure, the lead on which the solid-state optical element is mounted so as to face the reflection mirror is extracted as the external terminal. Therefore, encapsulation of the solid-state optical element, part of the lead and the reflection member as well as molding of the radiation surface can be performed by the potting mold. Consequently, there are many choices of the encapsulating materials to be used. Moreover, an encapsulating material that is hard to be yellowed can be selected and used. Since the potting mold does not need high accuracy, it is easy to fabricate the metal mold. Therefore, the optical device is excellent in mass-productivity. Furthermore, since the solid-state optical element is disposed so as to face the reflection mirror, the reflective optical device has high light condensation/radiation efficiency or high light incident efficiency and little dislocation of the axis.

Since the reflection mirror is not made by vapor-deposition, it has durability against a temperature change and does not lose its function as the reflection mirror due to generation of wrinkles caused by the temperature change that has been found in a reflection mirror having a metal vapor-deposited on a resin surface. Therefore, the optical device can be processed in a reflow furnace for surface mounting and can be used as surface mounting parts without any limits. Consequently, the optical device is suitable as reflective optical devices that are mounted in a great amount. Moreover, in such structure of the reflective optical device, it is unnecessary to provide an extra space for lead extracting portions, so that the optical device is suitable for miniaturization, too.

As described above, the reflective optical device has high light condensation/radiation efficiency or high light incident efficiency and little dislocation of the axis. Moreover, the optical device can be processed in the reflow furnace and miniatured. Furthermore, it is easy to fabricate the metal mold and the encapsulating a material resistant to yellowing can be used. In addition, the optical device is excellent in mass-productivity.

In a reflective optical device, the reflection member may be made of a metal.

Accordingly, since the reflection mirror is made of the metal, it has durability against a temperature change and does not lose its function as the reflection mirror due to generation of wrinkles caused by the temperature change that has been found in a reflection mirror having a metal vapor-deposited on a resin surface. Therefore, the optical device can be processed in a reflow furnace for surface mounting and can be used as surface mounting parts without any limits. Consequently, the optical device is suitable as reflective optical devices that are mounted in a great amount. Moreover, in such structure of the reflective optical device, it is unnecessary to provide an extra space for lead extracting portions, so that the optical device is suitable for miniaturization, too.

Since the reflection member is made of the metal, there is no possibility that the reflection mirror is deformed due to heat at the time of encapsulation as in the case of a reflection member made of a resin. Moreover, there is no possibility that the reflection member hurts the lead when secured to the lead as in the case of a reflection member made of ceramics. Thus, the reflection member has good compatibility with the lead.

In a reflective optical device, the reflection member may be made of a metal plate.

Accordingly, successive plural reflection mirrors can be fabricated at once by pressing the metal plate, thereby improving mass-productivity. Since the reflection mirror is made of the metal plate, it has durability against a temperature change and does not lose its function as the reflection mirror due to generation of wrinkles caused by the temperature change that has been found in a reflection mirror having a metal vapor-deposited on a resin surface. Therefore, the optical device can be processed in a reflow furnace for surface mounting and can be used as surface mounting parts without any limits. Consequently, the optical device is suitable as reflective optical devices that are mounted in a great amount. Moreover, it is possible to easily manufacture an optical device of different specification of light distribution only by changing a punch for forming the reflection mirror. There is no need to fabricate a new metal mold each time.

In a reflective optical device, the reflection mirror may be made only of the reflection member itself.

Accordingly, the reflection mirror can be formed only by pressing an aluminum plate having high linear reflectance as it is, for example. Therefore, the manufacturing process is shortened and the reflective optical device can be manufactured in short time as compared with the case in which a brass reflection member is pressed and plated with silver so as to form a reflection mirror, for example.

In a reflective optical device, the reflection mirror of the reflection member may have a linear reflectance of about 65% or more.

As materials having such high linear reflectance, there are exemplified a coined rolled aluminum, a high-luminance aluminum that has been mirror-finished at the time of rolling, a material with a silver plating to heighten the linear reflectance, etc. With the reflection mirror having such high linear reflectance, scattering of the light is restrained to a very low level at a reflecting point in case of a reflective LED. Therefore, it is possible to provide high light condensation factor. Particularly, if the LED element is encapsulated by the light transmitting resin, the light scattered at the reflection surface is further refracted when radiated from the light radiation surface, thereby increasing scattering rate. Therefore, it is important to keep the linear reflectance high. In case of a reflective PD or a reflective PT, scattering of the incident light is restrained, so that a photo-detecting factor is heightened more. As described above, if the linear reflectance of the reflection mirror is about 65% or more, there is provided a reflective optical device that has superior property.

In a reflective optical device, the lead may be extracted to a side of the encapsulating material facing a side surface of the solid-state optical element.

Accordingly, an outline of a member to be made by potting mold becomes thin. Moreover, it is possible to make thin an inside space of a mold for the potting mold. Therefore, the potting mold becomes easy and an amount of used encapsulating resin can be saved to a large degree.

In a reflective optical device, the lead may be extracted to a side of the encapsulating material facing a back surface of the solid-state optical element.

Accordingly, the optical device becomes ready for surface mounting only by bending the lead along the bottom surface of the encapsulating material (corresponding to a front surface of the encapsulating material at the time of potting mold) after the lead and the reflection member are encapsulated by potting mold. Thus, there is provided a reflective optical device that is easy to be surface-mounted.

In a reflective optical device, the reflection member may have a reflection member support at a leading end side that is an opposite side to an extracting side of the lead. The reflection member is connected to the reflection member to support the reflection member. A leading end side of the lead is extended so as to overlap with the reflection member support. The leading end side of the lead and the reflection member support are tightly contacted and encapsulated by the encapsulating material.

Accordingly, the leading end portion of the lead is pressed to the reflection member support. Thereby, the lead and the border of the reflection mirror are tightly contacted, so that the solid-state optical element is more surely and strongly fixed at the center of the reflection mirror. Thus, there is provided a reflective optical device that can fix the solid-state optical element more surely and strongly at the center of the reflection mirror.

According to a third aspect of the invention, there is provided a manufacturing method of a reflective optical device, comprising the steps of: fixing a lead frame and a reflection member in a fixed positional relationship, the lead frame having a lead while the lead having a solid-state optical element mounted thereon, and the reflection member having a reflection mirror; and encapsulating the solid-state optical element, the reflection mirror and part of the lead frame in a concave mold by filling the concave mold with an encapsulating material, while molding an optical radiation surface and/or optical incident surface at a back side of the solid-state optical element.

According to the manufacturing method by such potting mold, there is provided a reflective optical device that has high light condensation/radiation efficiency or high light incident efficiency while having little dislocation of an axis. Moreover, if the solid-state optical element is retained at a fixed position (center) relative to the reflection mirror, an upward or downward dislocation thereof at the time of potting mold never affects dislocation of an axis. With the potting mold, the metal mold does not require high accuracy and it is enough to mold only the light radiation surface and/or the light incident surface. Therefore, it is easy to fabricate the metal mold. Since there are many choices in selecting the encapsulating materials in case of the potting mold, the life of the reflective optical device becomes long if using an encapsulating a material resistant to yellowing. If a reflection mirror having durability against a temperature change, it does not lose its function as the reflection mirror due to generation of wrinkles caused by the temperature change that has been found in a reflection mirror having a metal vapor-deposited on a resin surface. Therefore, the optical device can be processed in a reflow furnace for surface mounting and can be used as surface mounting parts without any limits. Consequently, the optical device is suitable as reflective optical devices that are mounted in a great amount. Moreover, in such structure of the reflective optical device, it is unnecessary to provide an extra space for lead extracting portions, so that the optical device is suitable for miniaturization, too.

As described above, there is provided a manufacturing method for the reflective optical device that has high light condensation/radiation efficiency or high light incident efficiency and little dislocation of the axis. Moreover, there is provided a manufacturing method for the optical device that can be processed in the reflow furnace and miniatured. Furthermore, there is provided a manufacturing method for the optical device by which it is easy to fabricate the metal mold and which the encapsulating a material resistant to yellowing can be used.

In a manufacturing method of a reflective optical device, a multiplicity of the leads may be successively formed on the lead frame. A multiplicity of the reflection mirrors are successively formed on the reflection member. The solid-state optical element is mounted on each of the leads.

Accordingly, many pairs of the leads with the solid-state optical elements mounted and the reflection mirrors are arranged easily in a large number by laying the lead frame and the reflection member on each other. On the other hand, a metal mold for the potting mold is easy to be fabricated. It is also easy to fabricate many molds in accordance with an arranged distance of the leads and the reflection mirrors. Then, the same number of the pairs of the leads and the reflection mirrors and the molds for the potting mold are prepared. Thereafter, each pair of the lead and the reflection mirror is set in each mold. The mold is filled in each mold. Then, they are passed through a heating zone to be hardened. Thereafter, the leads and the reflection mirrors are taken out of the molds. Thus, there are manufactured many reflective optical devices.

As described above, there is provided a manufacturing method for the reflective optical devices that can be easily mass-produced while having superior characteristics.

In a manufacturing method of a reflective optical device, the reflection member may have a reflection member support at a leading end. A leading end side of the lead is extended so as to be overlap with the reflection member support. An inside shape of the mold is tapered toward a leading end of the mold.

Accordingly, the leading end portion of the lead is pressed against the reflection member support as the fixed lead and the reflection mirror are inserted into the mold. Thereby, the lead is tightly contacted with the border of the reflection mirror. Then, the solid-state optical element is secured more surely and strongly to the center of the reflection mirror.

As described above, there is provided a manufacturing method for the reflective optical devices that can easily secure the solid-state optical element more surely and strongly at the center of the reflection mirror.

According to a fourth aspect of the invention, there is provided a manufacturing method of a reflective optical device. The reflective optical device comprises a solid-state optical element, a lead, an encapsulating material and a reflection member. The manufacturing method comprises the steps of: mounting the solid-state optical element on the lead; laying a lead frame supporting the lead and a reflection member having the reflection mirror on each other so that at least part of the lead frame around a portion of the lead on which the solid-state optical element is mounted and at least part of the reflection member around the reflection mirror are overlapped with each other and so that an overlapped part reaches a surrounding of the reflection mirror about the reflection mirror; and holding at least part of the overlapped portion of the lead frame and the reflection member between a pair of molds so as to dispose the reflection mirror and the lead in a cavity formed in the molds, thereby encapsulating the reflection mirror and the lead by an encapsulating material.

With the manufacturing method, the solid-state optical element mounted on the lead can be located so as to face the reflection mirror. Therefore, the reflective optical device has high light condensation/radiation efficiency or high light incident efficiency as well as little dislocation of the axis. Since the reflection surface is formed by the metal plate having the reflection mirror, it has durability against a temperature change and a physical contact and does not lose its function as the reflection mirror due to generation of wrinkles caused by the temperature change that has been found in a reflection mirror having a metal vapor-deposited on a resin surface. Therefore, the optical device can be processed in a reflow furnace for surface mounting and can be used as surface mounting parts without any limits. Consequently, the optical device is suitable as reflective optical devices that are mounted in a great amount. Moreover, in such structure of the reflective optical device, it is unnecessary to provide an extra space for lead extracting portions, so that the optical device is suitable for miniaturization, too. Furthermore, it can deal with change of light distribution property only by changing the shape of the reflection surface and there is no need to fabricate a new metal mold each time.

As described above, there is provided a manufacturing method of the reflective optical device that has high light condensation/radiation efficiency or high light incident efficiency and little dislocation of the axis. Moreover, the optical device can be processed in the reflow furnace and miniatured. Furthermore, it is unnecessary to renew the metal mold each time the light distribution property is changed so that the manufacturing method is excellent in mass-productivity.

According to a fifth aspect of the invention, there is provided a manufacturing method of a reflective optical device, comprising the steps of: mounting a solid-state optical element on a lead; mounting the lead supported on a lead frame on a reflection mirror provided on a reflection member so that the solid-state optical element faces the reflection mirror; and holding the reflection member and the lead frame between metal molds and encapsulating the reflection member and the lead frame by an encapsulating resin after deforming a reflection mirror support, which is provided on the reflection member so as to extend outward from the reflection mirror, at a middle position thereof to a same height as the lead so that a portion of the reflection member corresponding to the reflection mirror is disposed within a thickness of a portion of the lead frame corresponding to the reflection mirror.

In the manufacturing method, since the reflection mirror support is deformed by bending or the like so as to come to the same height as the lead, it is sufficient to seal a circumference of the cavity with a thickness of one plate. Therefore, the seal is improved and the resin leakage is minimized or eliminated. Consequently, the metal mold can be fabricated easily. Moreover, the plate-shaped burr has a thickness of one plate, so that the burr can be easily removed after molding and there is no possibility that crack is generated at a resin sealed portion at the time of removing the burrs.

Since the solid-state optical element mounted on the lead can be located so as to face the reflection mirror, the reflective optical device has high light condensation/radiation efficiency or high light incident efficiency as well as little dislocation of the axis. Since the reflection surface is formed by the reflection mirror, it has durability against a temperature change and a physical contact and does not lose its function as the reflection mirror due to generation of wrinkles caused by the temperature change that has been found in a reflection mirror having a metal vapor-deposited on a resin surface. Therefore, the optical device can be processed in a reflow furnace for surface mounting and can be used as surface mounting parts without any limits. Consequently, the optical device is suitable as reflective optical devices that are mounted in a great amount. Moreover, in such structure of the reflective optical device, it is unnecessary to provide an extra space for lead extracting portions, so that the optical device is suitable for miniaturization, too. Furthermore, it can deal with change of light distribution property only by changing the shape of the reflection surface and there is no need to fabricate a new metal mold each time.

As described above, there is provided a manufacturing method of the reflective optical device that improves the sealing property for the cavity at the time of molding and that has high light condensation/radiation efficiency or high light incident efficiency and little dislocation of the axis. Moreover, the optical device can be processed in the reflow furnace and miniatured. Furthermore, it is unnecessary to renew the metal mold each time the light distribution property is changed so that the manufacturing method is excellent in mass-productivity.

According to a sixth aspect of the invention, there is provided a manufacturing method of a reflective optical device, comprising the steps of: mounting a solid-state optical element on a lead; mounting the lead supported on a lead frame on a reflection mirror provided on a reflection member so that the solid-state optical element faces the reflection mirror; and holding the reflection member and the lead frame between metal molds and encapsulating the reflection member and the lead frame by an encapsulating resin after deforming the lead to a same height as a reflection mirror support, which is provided on the reflection member so as to extend outward from the reflection mirror, so that a portion of the lead frame corresponding to the reflection mirror is disposed within a thickness of a portion of the reflection member corresponding to the reflection mirror.

In this invention, contrary to the fifth aspect of the invention, the lead is deformed so as to come to the same height as the reflection mirror support. Thereby, it is sufficient to seal a circumference of the cavity with a thickness of one plate. Therefore, sealing property improves and leakage of the resin lessens extremely. Consequently, the metal mold can be fabricated easily. Moreover, the plate-shaped burr has a thickness of one plate, so that the burr can be easily removed after molding and there is no possibility that crack is generated at a resin sealed portion at the time of removing the burrs.

Since the solid-state optical element mounted on the lead can be located so as to face the reflection mirror, the reflective optical device has high light condensation/radiation efficiency or high light incident efficiency as well as little dislocation of the axis. Since the reflection surface is formed by the reflection mirror, it has durability against a temperature change and a physical contact and does not lose its function as the reflection mirror due to generation of wrinkles caused by the temperature change that has been found in a reflection mirror having a metal vapor-deposited on a resin surface. Therefore, the optical device can be processed in a reflow furnace for surface mounting and can be used as surface mounting parts without any limits. Consequently, the optical device is suitable as reflective optical devices that are mounted in a great amount. Moreover, in such structure of the reflective optical device, it is unnecessary to provide an extra space for lead extracting portions, so that the optical device is suitable for miniaturization, too. Furthermore, it can deal with change of light distribution property only by changing the shape of the reflection surface and there is no need to fabricate a new metal mold each time.

As described above, there is provided a manufacturing method of the reflective optical device that improves the sealing property for the cavity at the time of molding and that has high light condensation/radiation efficiency or high light incident efficiency and little dislocation of the axis. Moreover, the optical device can be processed in the reflow furnace and miniatured. Furthermore, it is unnecessary to renew the metal mold each time the light distribution property is changed so that the manufacturing method is excellent in mass-productivity.

According to a seventh aspect of the invention, there is provided a reflective optical device comprising: a solid-state optical element, a lead, an encapsulating material and a reflection mirror. The solid-state optical element is mounted on the lead. The reflection member has a reflection mirror formed thereon. The reflection mirror is disposed at a position facing the solid-state optical element. The reflection mirror has a border portion disposed within a height of a rear surface of the lead from a surface of the lead on which the solid-state optical element is mounted. The encapsulating material encapsulates the solid-state optical element and the reflection mirror so as to form a light radiation surface and/or a light incident surface at a back of the solid-state optical element.

In the reflective optical device, the lead and the reflection mirror support are not overlapped at a mating face of the cavity of the metal mold as in the fourth aspect of the invention. They are located at the same plane. Therefore, it is sufficient to seal a circumference of the cavity with a thickness of one plate. Therefore, sealing property improves and leakage of the resin lessens extremely. Consequently, the metal mold can be fabricated easily. Moreover, the plate-shaped burr has a thickness of one plate, so that the burr can be easily removed after molding and there is no possibility that crack is generated at a resin sealed portion at the time of removing the burrs.

If the reflection mirror is located so as to face the solid-state optical element mounted on the lead, the reflective optical device has high light condensation/radiation efficiency or high light incident efficiency as well as little dislocation of the axis. Since the reflection surface is formed by the reflection mirror, it has durability against a temperature change and a physical contact and does not lose its function as the reflection mirror due to generation of wrinkles caused by the temperature change that has been found in a reflection mirror having a metal vapor-deposited on a resin surface. Therefore, the optical device can be processed in a reflow furnace for surface mounting and can be used as surface mounting parts without any limits. Consequently, the optical device is suitable as reflective optical devices that are mounted in a great amount. Moreover, in such structure of the reflective optical device, it is unnecessary to provide an extra space for lead extracting portions, so that the optical device is suitable for miniaturization, too. Furthermore, it can deal with change of light distribution property only by changing the shape of the reflection surface and there is no need to fabricate a new metal mold each time.

Since the border portion of the reflection mirror is located within the height of the rear surface of the lead from the surface of the lead on which the solid-state optical element is mounted, a solid angle of the reflection mirror becomes $2\pi$ steradian or more. Therefore, quantity of light that is emitted from the solid-state optical element via the reflection mirror or that enters the solid-state optical element is enlarged.

As described above, there is provided a reflective optical device that has high light condensation/radiation efficiency or high light incident efficiency and little dislocation of the axis. Moreover, the optical device can be processed in the reflow furnace and miniatured. Furthermore, it is unnecessary to renew the metal mold each time the light distribution property is changed so that the manufacturing method is excellent in mass-productivity.

Further objects and advantages of the invention will be apparent from the following description, reference being had to the accompanying drawings, wherein preferred embodiments of the invention are clearly shown.

DETAILED DESCRIPTION OF THE INVENTION

Figure 1:
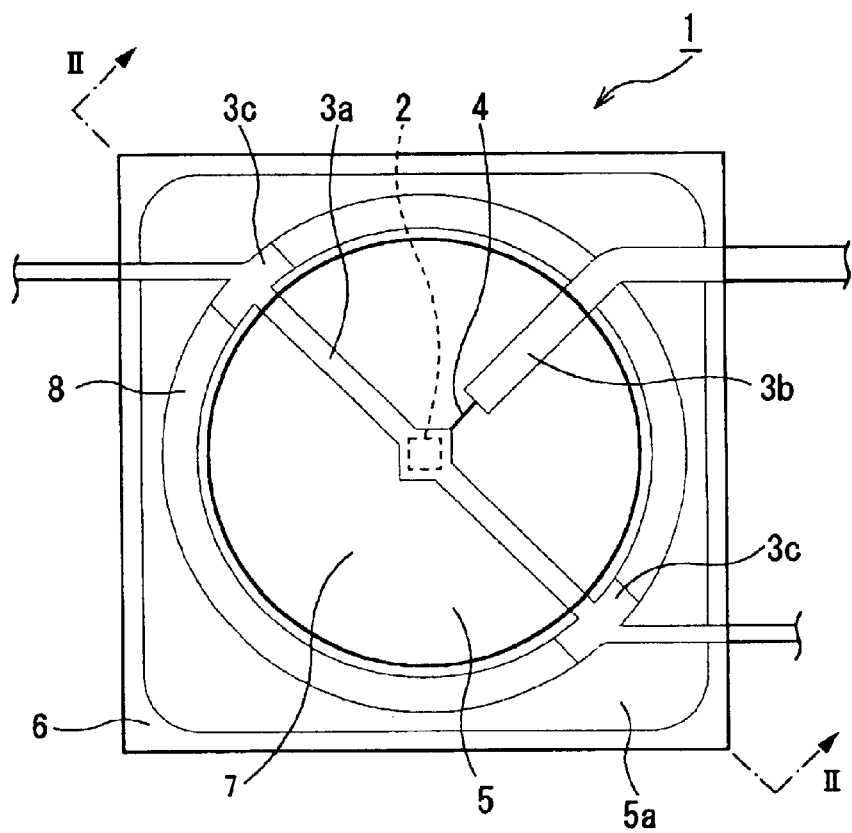
FIG. 1 is a plan view showing an overall construction of a reflective LED according to a first embodiment of the invention.

Several embodiments of the invention are described hereunder referring to the attached drawings. In the description, a reflective light emitting diode (reflective LED) is shown as an example of a reflective optical device. The same reference character is used to show the same element throughout the several embodiments.

First Embodiment

Figure 2:
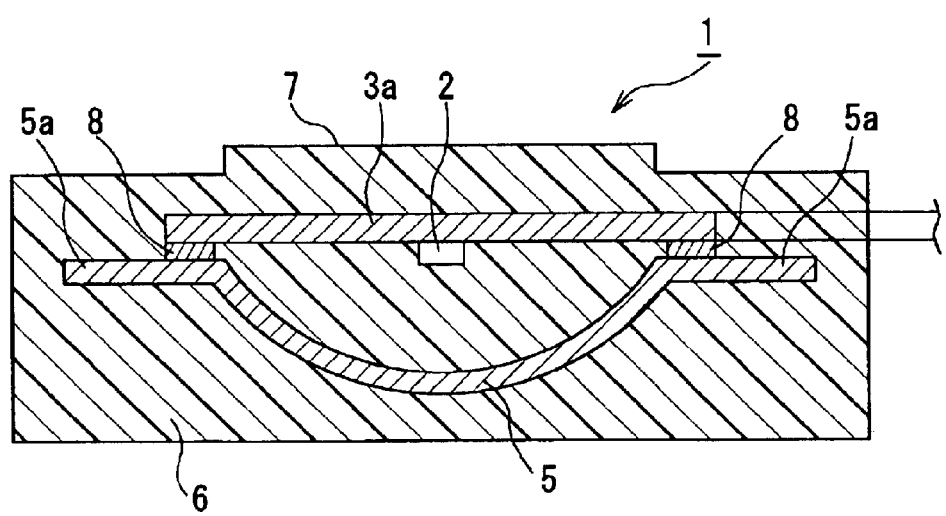
FIG. 2 is a cross-section taken along the line II—II of FIG. 1.

A first embodiment of the invention is described referring to FIG. 1 and FIG. 2. FIG. 1 is a plan view showing an overall construction of a reflective LED according to a first embodiment of the invention. FIG. 2 is a cross-section taken along the line II—II of FIG. 1.

As shown in FIG. 1 and FIG. 2, a first embodiment of a reflective LED 1 has a pair of leads 3a and 3b for supplying an electric power to an LED element 2. The LED element 2 is mounted on a lower surface of the one lead 3a. A wire 4 bonds the other lead 3b and the LED element 2 to electrically connect them. A reflection mirror 5 is formed into a concave surface shape by pressing an aluminum plate and attached to the leads 3a, 3b. A transparent epoxy resin 6 encapsulates the reflection mirror 5 as a whole. At the same time, a flat shape of a radiation portion 7 is molded on a surface of the epoxy resin 6 at a back of the LED element 2. The LED element 2 emits a green light. The lead 3a, 3b is made of a copper alloy plate of 0.3 mm thick on which a silver is plated. The encapsulation of the epoxy resin 6 is carried out by a potting mold.

The reflection mirror 5 uses an aluminum plate of 0.2 mm thick with a linear reflectance of 85% which is fabricated by such a working method as not to cause a trace of a roll at the time of rolling. Moreover, a consideration is taken so as to keep such surface roughness thereof The reflection mirror 5 is formed into a concave shape of substantially a paraboloid of revolution that has a solid angle of 2π steradian in relation to the LED element 2 and that has a focal point at the position of the LED element 2. Accordingly, at the reflection mirror 5, all the light emitted from the LED element 2 becomes a reflected light that is parallel to an axis of the parabolic surface of revolution. Then, the light is radiated from the radiation portion 7 at the back of the LED element 2.

A flat marginal portion 5a is formed as a heat-conducting portion along a circumference of the aluminum cup that defines the reflection mirror 5. A ring-shaped insulating sheet material 8 of 0.1 mm thick is disposed on the flat marginal portion 5a so as to surround the outer circumference of the reflection mirror 5. The one lead 3a is disposed on the insulating sheet material 8 such that two protruded portions 3c of the lead 3a are located just on the insulating sheet material 8. The lead 3a and the reflection mirror 5 are located close to each other with the sheet material 8 of 0.1 mm thick interposed therebetween. Since the two protruded portions 3c are provided, an area of an adjacent part formed between the lead 3a and the reflection mirror 5 becomes large, thereby increasing the heat radiation.

Since the sheet material 8 has the ring shape surrounding the border or the edge of the reflection mirror 5, the other lead 3b is insulated from the flat marginal portion 5a of the reflection mirror 5, too. Since the sheet material has the ring shape, there is an advantage that manufacture of the reflective LED 1 becomes easy. The sheet material 8 is not always limited to the ring shape surrounding the border of the reflection surface. The sheet material 8 may have another shape as long as it can insulate the two projected portions 3c of the one lead 3a or the other lead 3c from the marginal portion 5a of the reflection mirror 5

Such structure of the reflective LED 1 can control substantially all luminous flux emitted from the LED element 2. Therefore, the LED 1 has high external radiant efficiency and can provide many choices in design of the light radiation property such as the light distribution property. Consequently, the LED 1 can realize high luminous intensity. Moreover, the LED element 2 is located at a front surface side of the encapsulating resin 6. The lead 3a forming a heat radiation path of the LED element 2 is located at the front surface side of the encapsulating resin 6, too. The lead 3a with the LED element 2 mounted is disposed near the marginal portion 5a of the reflection mirror 5. Accordingly, heat radiated from the LED element 2 is also diffused to the reflection mirror 5 while conducted through the lead 3a and the marginal portion 5a. The reflection mirror 5 has such a thickness as to provide high heat conductivity and sufficient heat capacity. Therefore, the heat of the LED element 2 is released from the entire reflection mirror 5. Thus, the LED 1 is very much excellent in terms of the heat radiation.

It is only the radiation surface 7 that needs to be shaped by the resin molding as an optical surface. Then, the LED 1 can be easily produced only by steps of setting parts in a metal mold and encapsulating them by the resin regardless of the transfer mold or the potting mold. Thus, the LED 1 can be mass-produced. Since there are many choices in the manufacturing method, choices of the encapsulating material 6 increase, too. Therefore, the encapsulating material 6 can be selected according to use, such as a material having a low stress, a material having high heat-resistance or a material excellent in weather-resistance.

Since the first embodiment uses the reflection mirror 5 of concave shape formed by pressing the aluminum plate, the reflection mirror 5 has durability against a temperature change. Moreover, since no wrinkles are generated on the reflection mirror 5 caused by the temperature change as seen in the reflection mirror or the like with a metal vapor-deposited on a resin surface, the reflection mirror 5 never loses function as such. Therefore, the LED 1 can endure the process in the reflow furnace for surface mounting and is usable as surface-mounted parts without limits. Thus, the LED 1 is suitable as the reflective LEDs that are mounted in large quantity.

Though a number of the parts increases, a vapor-deposition step can be eliminated. Therefore, no consideration is necessary for the following steps, so that the resin encapsulation step can be simplified so as to increase yield. Moreover, no consideration is required for preventing short-circuit of the leads which are necessary when the vapor deposition is performed. Furthermore, no reinforcing portions need to be provided which are necessary when the leads are bent. Consequently, there is an advantage that a drawing-out distance of the leads can be small.

Since the reflection mirror 5 is made only by shaping the aluminum plate material having high linear reflectance by pressing, any plating treatment is unnecessary. Moreover, no consideration is required for corrosion of the plated metal, so that management of the material can be simplified. Since the aluminum material is a commonly and widely used material and is easily obtained.

As described above, the first embodiment of the reflective LED 1 has high external radiant efficiency and durability against the temperature change. Moreover, the LED 1 is easily manufactured and easily miniatured. Furthermore, the LED 1 is very much excellent in the heat radiation.

Second Embodiment

Figure 3:
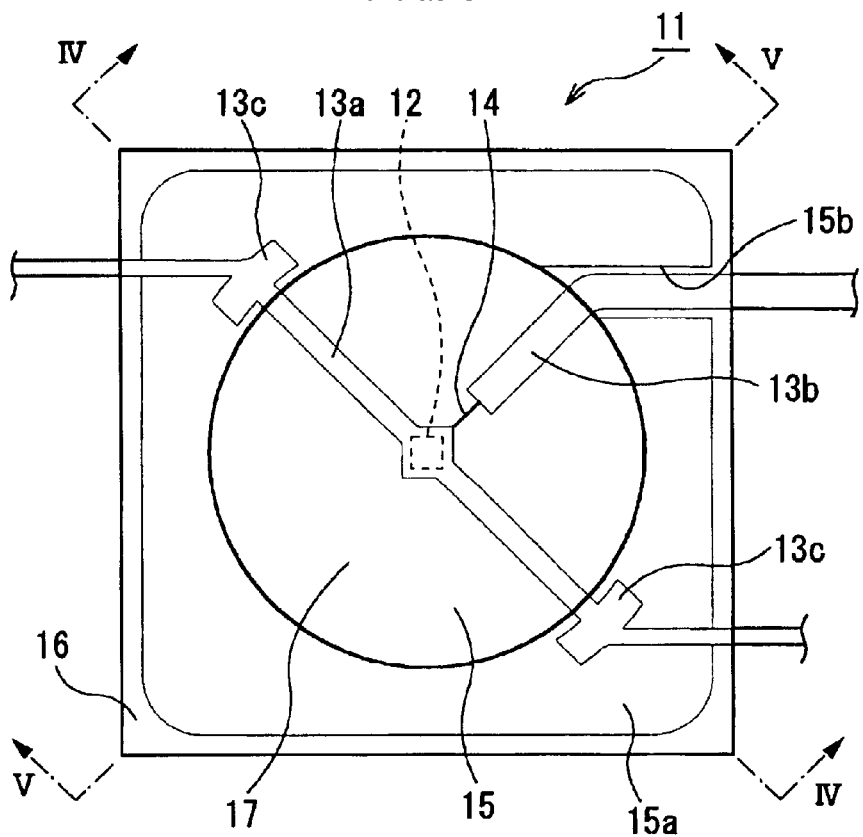
FIG. 3 is a plan view showing an overall construction of a reflective LED according to a second embodiment of the invention.
Figure 4:
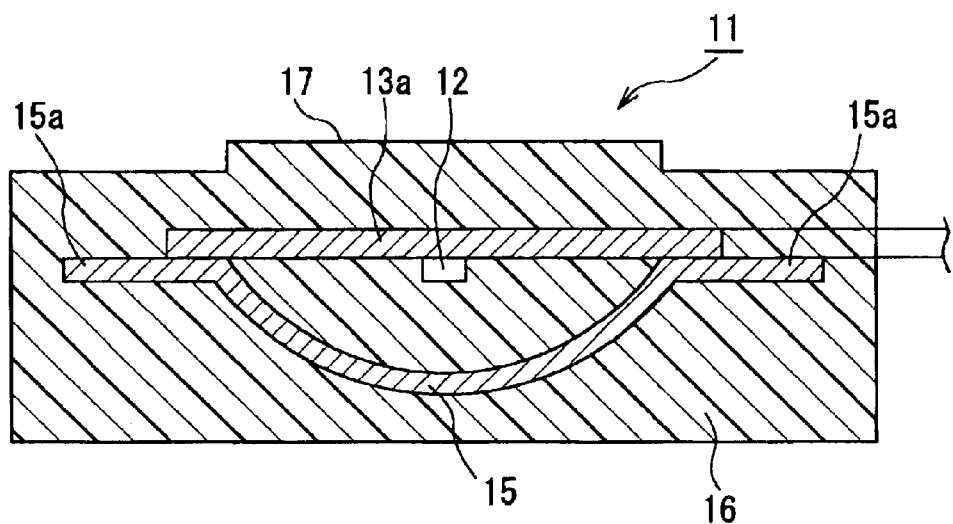
FIG. 4 is a cross-section taken along the line IV—IV of FIG. 3.
Figure 5:
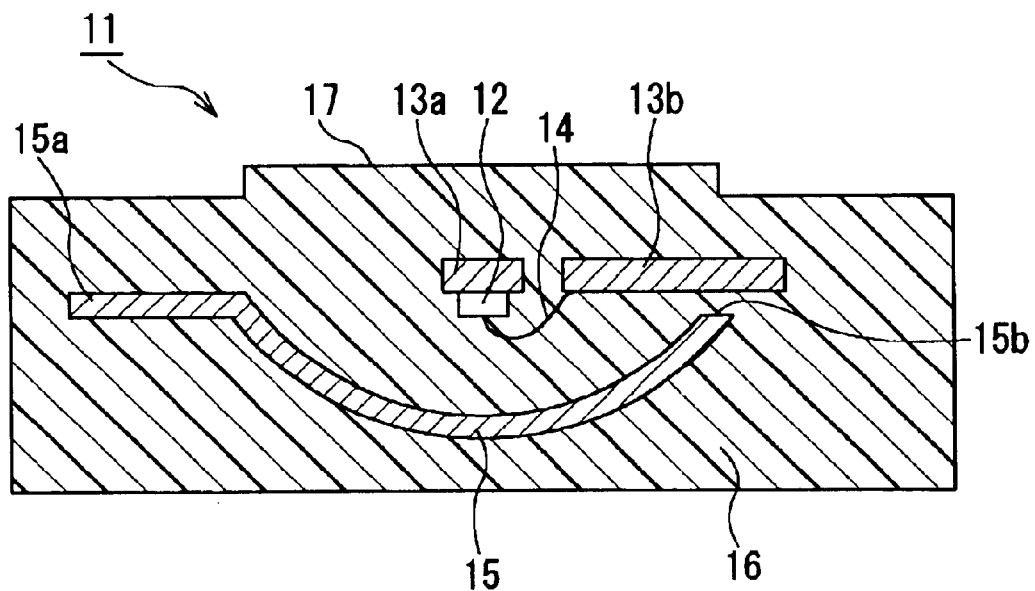
FIG. 5 is a cross-section taken along the line V—V of FIG. 3.

A second embodiment of the invention is described referring to FIG. 3 to FIG. 5. FIG. 3 is a plan view showing an overall construction of a reflective LED according to a second embodiment of the invention. FIG. 4 is a cross-section taken along the line IV—IV of FIG. 3. FIG. 5 is a cross-section taken along the line V—V of FIG. 3.

As shown in FIG. 3 and FIG. 4, a second embodiment of a reflective LED 11 has a pair of leads 13a and 13b for supplying an electric power to an LED element 12. The LED element 12 is mounted on a lower surface of the one lead 13a. A wire 14 bonds the other lead 13b and the LED element 12 to electrically connect them. A reflection mirror 15 is formed into a concave surface shape by pressing an aluminum plate and attached to the leads 13a, 13b. A transparent epoxy resin 16 encapsulates the reflection mirror 15 as a whole. At the same time, a flat shape of a radiation portion 17 is molded on a surface of the epoxy resin 16 at a back of the LED element 12. The LED element 12 emits a green light. The lead 13a, 13b is made of a copper alloy plate of 0.3 mm thick on which a silver is plated. The encapsulation of the epoxy resin 16 is carried out by a potting mold.

The reflection mirror 15 uses an aluminum plate with a linear reflectance of 85% which is fabricated by such a working method as not to cause a trace of a roll at the time of rolling. Moreover, a consideration is taken so as to keep such surface roughness thereof. The reflection mirror 15 is formed into a concave shape of substantially a paraboloid of revolution that has a solid angle of 2π steradian in relation to the LED element 12 and that has a focal point at the position of the LED element 12. Accordingly, at the reflection mirror 15, all the light emitted from the LED element 12 becomes a reflected light that is parallel to an axis of the parabolic surface of revolution. Then, the light is radiated from the radiation portion 17 at the back of the LED element 12.

A flat marginal portion 15a is formed as a heat-conducting portion along a circumference of the aluminum cup that defines the reflection mirror 15. The one lead 13a is directly contacted with the marginal portion 15a, while the lead 13a is provided with two protruded portions 13c. Therefore, head conductivity improves. Moreover, since the two protruded portions 13c are provided, a contact area between the lead 13a and the marginal portion 16a of the reflection mirror 15 becomes large, thereby increasing the heat radiation.

Since the one lead 13a and the marginal portion 15a of the reflection mirror 15 are contacted, the other lead 13b needs to be insulated from the marginal portion 15a of the reflection mirror 15. In the reflective LED 11 of the second embodiment, as shown in FIG. 3 and FIG. 5, a cutout portion 15b is provided at part of the reflection mirror 15 and the marginal portion 15a. The lead 13b passes through the cutout portion 15b. Thus, the lead 13b is insulated from the reflection mirror 15 and the marginal portion 15a. Since the cutout portion 15b is provided, there is an advantage that the insulation is assured without any working on the other lead 13b.

Figure 6:
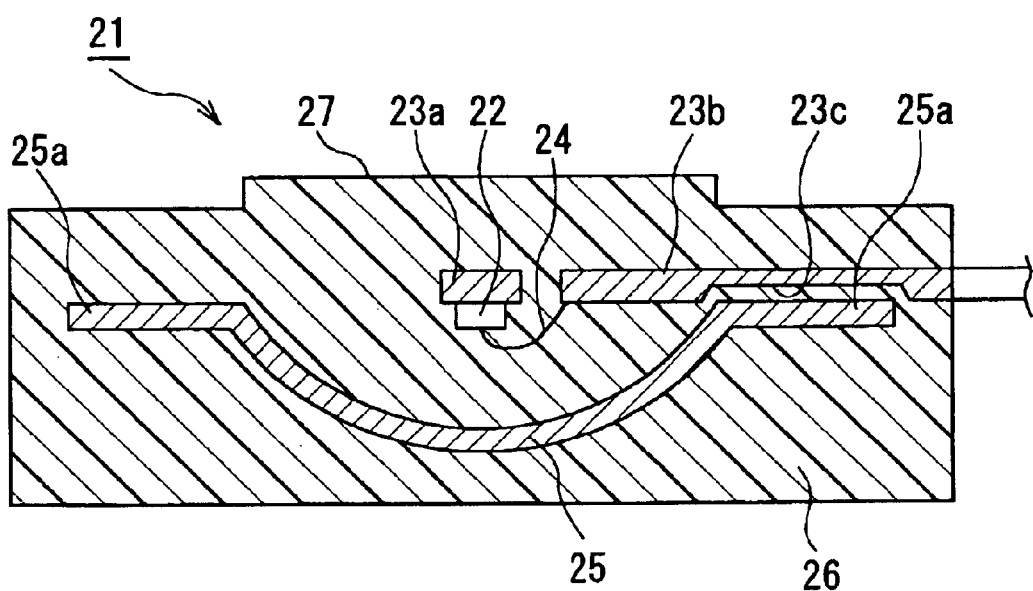
FIG. 6 is a plan view showing a modified embodiment of a reflective LED according to the second embodiment of the invention.

A modified example of the second embodiment is described referring to FIG. 6. FIG. 6 is a plan view showing a modified embodiment of a reflective LED according to the second embodiment of the invention.

As shown in FIG. 6, in a reflective LED 21 according to the modified example of the second embodiment, an LED element 22 is mounted on one lead 23a. The lead 23a is directly contacted with a marginal portion 25a of a reflection mirror 25 made of aluminum, too, as in the second reflective LED 11 shown in FIG. 3. A wire 24 bonds the LED element 22 and another lead 23b. The lead 23b has a lower surface cut off at an area corresponding to the marginal portion 25a of the reflection mirror 25, thereby defining a dented portion 23c. Thus, the lead 23b is not contacted with the marginal portion 25a of the reflection mirror 25 and insulation is assured between them.

Figure 7:
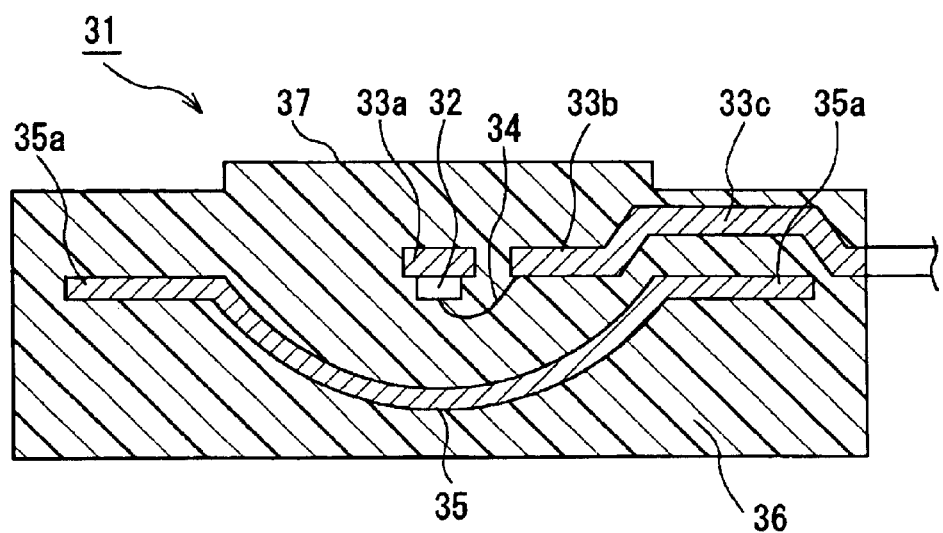
FIG. 7 is a plan view showing another modified embodiment of a reflective LED according to the second embodiment of the invention.

Another modified example of the second embodiment is described referring to FIG. 7. FIG. 7 is a plan view showing another modified embodiment of a reflective LED according to the second embodiment of the invention.

As shown in FIG. 7, in a reflective LED 31 according to the other modified example of the second embodiment, an LED element 32 is mounted on one lead 33a. The lead 33a is directly contacted with a marginal portion 35a of a reflection mirror 35 made of aluminum, too, as in the second reflective LED 11 shown in FIG. 3. A wire 34 bonds the LED element 32 and another lead 33b. The lead 33b has an area bent upward corresponding to the marginal portion 35a of the reflection mirror 35, thereby defining a bridge portion 33c. Thus, the lead 33b is not contacted with the marginal portion 35a of the reflection mirror 35 and insulation is assured between them.

As described above, in the modified example of the reflective LED 21 shown in FIG. 6 and the other modified example of the reflective LED 31 show in FIG. 7, the other lead 23b, 33b need some working. Instead, the reflection mirror 25, 35 can be pressed into a normal shape. Therefore, it is possible to stabilize molding accuracy of the reflection surface of the reflection mirror 25, 35.

Such structure of the reflective LED 11, 21, 31 can control substantially all luminous flux emitted from the LED element 12, 22, 32 and radiate the light to the outside. Therefore, the LED 11, 21, 31 has high external radiant efficiency and can provide many choices in design of the light radiation property such as the light distribution property. Consequently, the LED 11, 21, 31 can realize high luminous intensity. Moreover, the LED element 12, 22, 32 is located at a front surface side of the encapsulating resin 16, 26, 36. The lead 13a, 23a, 33a forming a heat radiation path of the LED element 12, 22, 32 is located at the front surface side of the encapsulating resin 16, 26, 36, too. The lead 13a is directly contacted with the marginal portion 15a, 25a, 35a of the reflection mirror 15, 25, 35. Accordingly, heat radiated from the LED element 12, 22, 32 is released from the entire reflection mirror 15, 25, 35 while conducted through the lead 13a, 23a, 33a and the marginal portion 15a, 25a, 35a. Thus, the LED 11, 21, 31 is very much excellent in terms of the heat radiation.

It is only the radiation surface 17, 27, 37 that needs to be shaped by the resin molding as an optical surface. Then, the LED 11, 21, 31 can be easily produced only by steps of setting parts in a metal mold and encapsulating them by the resin regardless of the transfer mold or the potting mold. Thus, the LED 11, 21, 31 can be mass-produced. Since there are many choices in the manufacturing method, choices of the encapsulating material 16, 26, 36 increase, too. Therefore, the encapsulating material 16, 26, 36 can be selected according to use, such as a material having a low stress, a material having high heat-resistance or a material excellent in weather-resistance.

Since the second embodiment uses the reflection mirror 15, 25, 35 of concave shape formed by pressing the aluminum plate, the reflection mirror 15, 25, 35 has durability against a temperature change. Moreover, since no wrinkles are generated on the reflection mirror 15, 25, 35 caused by the temperature change as seen in the reflection mirror or the like with a metal vapor-deposited on a resin surface, the reflection mirror 15, 25, 35 never loses function as such. Therefore, the LED 11, 21, 31 can endure the process in the reflow furnace for surface mounting and is usable as surface-mounted parts without limits. Thus, the LED 11, 21, 31 is suitable as the reflective LEDs that are mounted in large quantity.

As described above, the second embodiment of the reflective LED 11, 21, 31 has high external radiant efficiency and durability against the temperature change. Moreover, the LED 11, 21, 31 is easily miniatured and very much excellent in the heat radiation.

Third Embodiment

Figure 8:
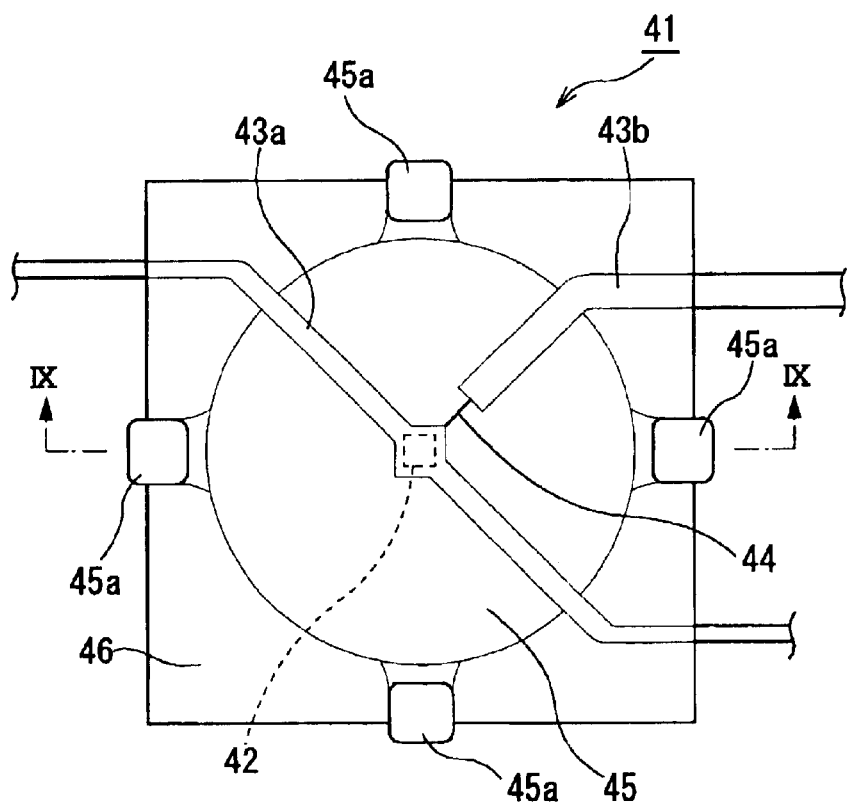
FIG. 8 is a plan view showing an overall construction of a reflective LED according to a third embodiment of the invention.
Figure 9:
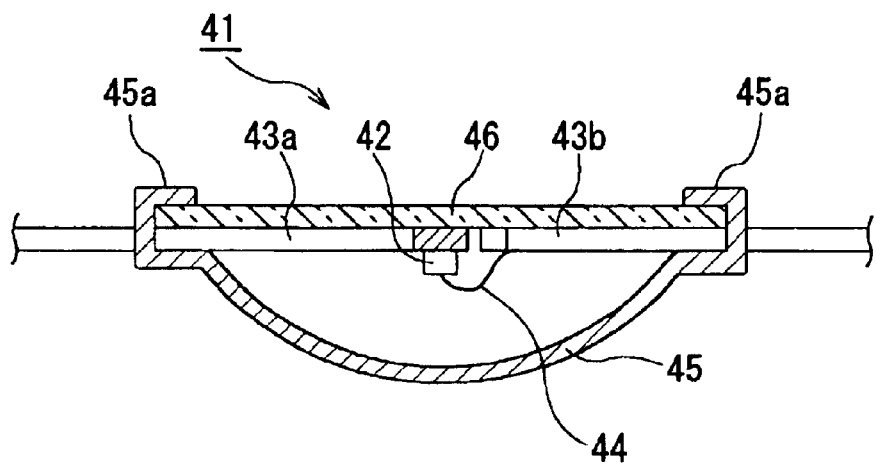
FIG. 9 is a cross-section taken along the line IX—IX of FIG. 8.

A third embodiment of the invention is described referring to FIG. 8 and FIG. 9. FIG. 8 is a plan view showing an overall construction of a reflective LED according to a third embodiment of the invention. FIG. 9 is a cross-section taken along the line IX—IX of FIG. 8.

As shown in FIG. 8 and FIG. 9, a third embodiment of a reflective LED 41 has a pair of leads 43a and 43b for supplying an electric power to an LED element 42 that emits ultraviolet light. The LED element 42 is mounted on a lower surface of the one lead 43a. A wire 44 bonds the other lead 43b and the LED element 42 to electrically connect them. Thus, a lead portion is constructed. A reflection mirror 45 is formed into a concave surface shape by pressing an aluminum plate. A glass plate 46 constitutes a radiation portion.

The lead portion 43a, 43b, the reflection mirror 45 and the glass plate 46 are assembled.

The reflection mirror 45 uses an aluminum plate with a linear reflectance of 85% which is fabricated by such a working method as not to cause a trace of a roll at the time of rolling, in the same manner as the first and second embodiments. Moreover, a consideration is taken so as to keep such surface roughness thereof. The reflection mirror 45 is formed into a concave shape of substantially a paraboloid of revolution that has a solid angle of $2\pi$ steradian in relation to the LED element 42 and that has a focal point at the position of the LED element 42. Accordingly, at the reflection mirror 45, all the ultraviolet light emitted from the LED element 42 becomes a reflected light that is parallel to an axis of the parabolic surface of revolution. Then, the light is radiated from the glass plate radiation portion 46 at the back of the LED element 42.

In the third embodiment, an oxidation treatment is provided on a front surface of the reflection mirror 45 of aluminum plate, thereby forming an insulating layer of alumite. Since the alumite has passive state, if the oxidized layer is formed once, the oxidization progresses no more. The linear radiant efficiency is scarcely lowered due to the oxidizing treatment. Since the insulation layer is formed over the surface of the reflection mirror 45, though a pair of the leads 43a and 43b is contacted directly with the reflection mirror 45, the leads 43a and 43b are never short-circuited. Hooking claws 45a are provided at four positions along an outer circumference of the reflection mirror 45. The four hooking claws 45a hook an upper surface of the glass plate 46 as the radiation portion. Thus, a pair of the leads 43a and 43b is held and assembled between the glass plate 46 and the reflection mirror 45.

Since the reflection mirror 45 is made of the aluminum plate, it has high reflectance efficiency at a wavelength zone from the visible light to the ultraviolet light. There is no need for plating. Particularly, the reflectance efficiency of the silver becomes very low at the zone of the ultraviolet rays emitted from the third embodiment of the LED element 42. In contrast, the reflection mirror 45 made of aluminum can get high reflectance efficiency for the ultraviolet rays that cannot be obtained by the widely used silver plating. Some steps are necessary to form an aluminum reflection surface such as vapor deposition on some member or the like. In the invention, by using the aluminum plate, the vapor and sputter deposition processes for forming a reflection surface can be avoided.

The reflection mirror 45 is formed into substantially a paraboloid of revolution that has a focal point at the position of the LED element 42. Accordingly, at the reflection mirror 45, all the ultraviolet rays emitted from the LED element 42 are reflected in a direction that is parallel to an axis of the parabolic surface of revolution. The glass plate radiation portion 46 is located in such direction. The surface roughness of the radiation portion 46 can be easily made into a surface roughness of an optical level. Therefore, there is no scattering of the ultraviolet rays at the radiation portion 46, either. The ultraviolet rays reflected at the reflection mirror 45 are radiated from the radiation portion 46 in the same direction.

Such structure of the reflective LED 41 can control substantially all luminous flux of the ultraviolet light emitted from the LED element 42 and radiate the light to the outside. Therefore, the LED 41 has high external radiant efficiency and can provide many choices in design of the light radiation property such as the light distribution property. Moreover, since the reflective LED 41 is not encapsulated with a synthetic resin, there is no problem of degradation of the resin caused by the ultraviolet light or short wavelength light in the visible light. The one lead 43a is directly contacted with the reflection mirror 45. Accordingly, heat of the LED element 42 is released from the entire reflection mirror 45 while conducted from the lead 43a to the reflection mirror 45. Thus, the LED 41 is very much excellent in terms of the heat radiation. Consequently, the LED 41 can realize high luminous intensity, thereby providing the reflective ultraviolet LED that can be put into practice.

Fourth Embodiment

Figure 10:
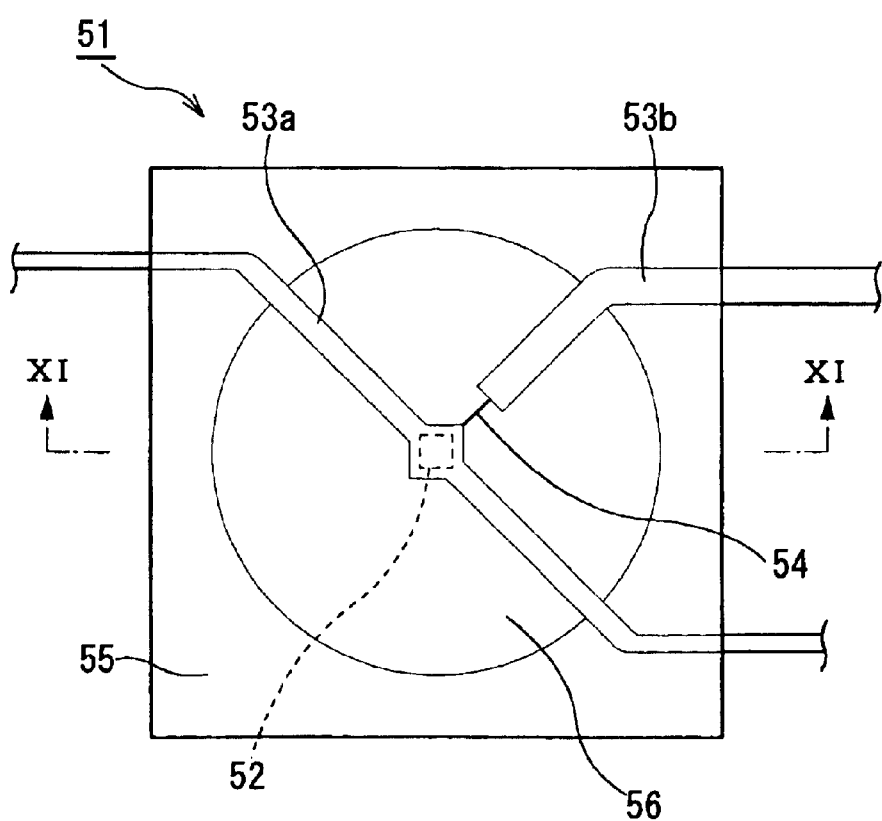
FIG. 10 is a plan view showing an overall construction of a reflective LED according to a fourth embodiment of the invention.
Figure 11:
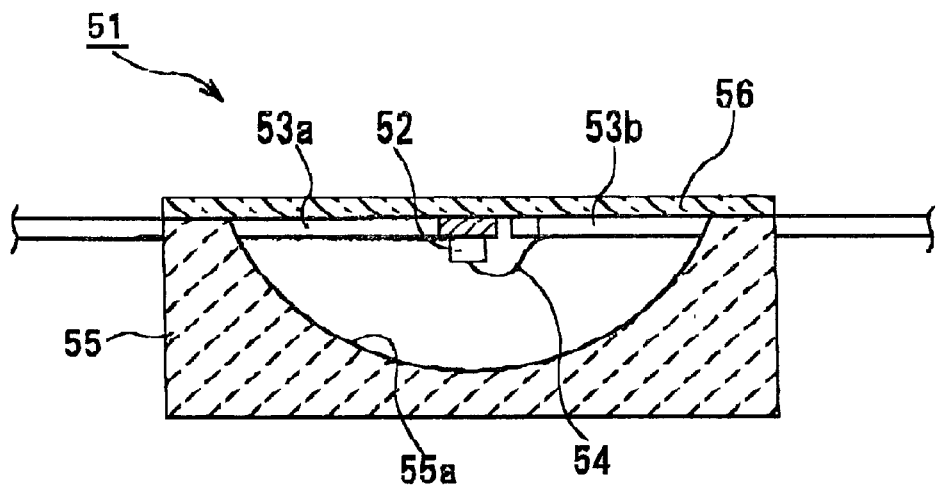
FIG. 11 is a cross-section taken along the line XI—XI of FIG. 10.

A fourth embodiment of the invention is described referring to FIG. 10 and FIG. 11. FIG. 10 is a plan view showing an overall construction of a reflective LED according to a fourth embodiment of the invention. FIG. 11 is a cross-section taken along the line XI—XI of FIG. 10.

Figure 12:
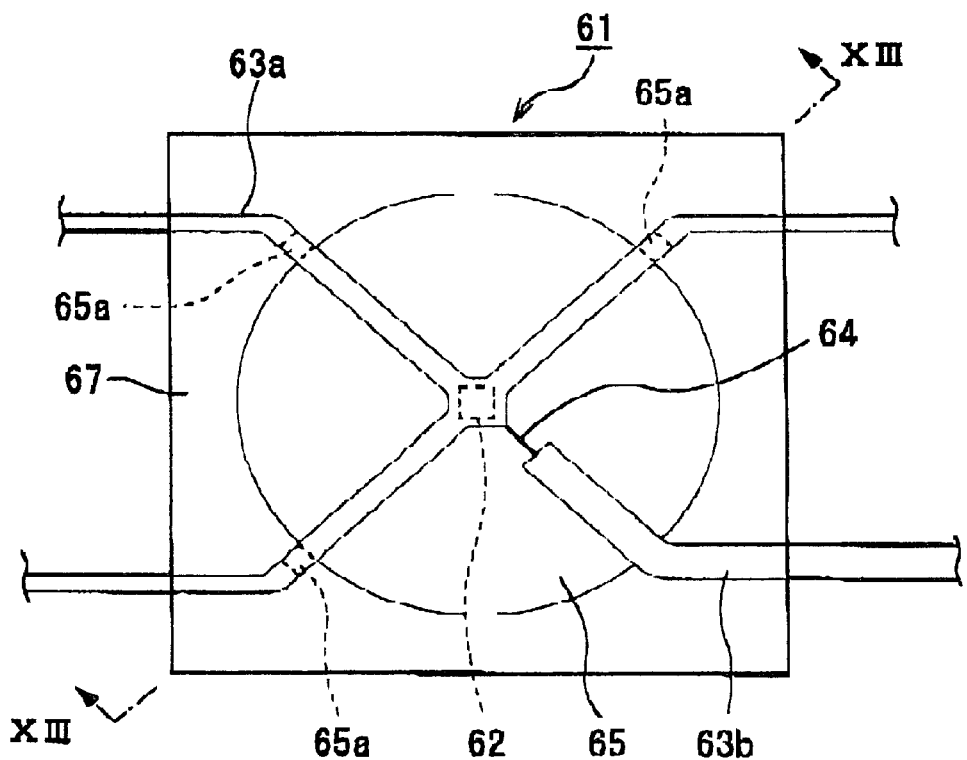
FIG. 12 is a plan view showing an overall construction of a reflective LED according to a fifth embodiment of the invention.

As shown in FIG. 11 and FIG. 12, a fourth embodiment of a reflective LED 51 does not use a metal reflective mirror but an alumina (Al2O3) 55 having high heat conductivity. The alumina 55 has a reflective surface 55a formed into substantially a paraboloid of revolution on which an aluminum and silicon dioxide (SiO2) is vapor-deposited, thereby defining a reflection mirror. The reflective LED 51 has a pair of leads 53a and 53b for supplying an electric power to an LED element 52 that emits ultraviolet light. The LED element 52 is mounted on a lower surface of the one lead 53a. A wire 54 bonds the other lead 53b and the LED element 52 to electrically connect them. The reflective mirror body 55 made of alumina has three recesses or dents in which the pair of the lead 53a and 53b is fitted. A glass plate 56 as a radiation portion is fixed by adhesive thereon so as to complete the reflective LED 51.

In such structure of the reflective LED 51, the one lead 53a has two positions contacted tightly with the reflection mirror body 55 having high heat conductivity. Accordingly, heat of the LED element 52 is released from the entire reflection mirror body 55 while conducted from the lead 53a to the reflection mirror body 55. Thus, the LED 51 is very much excellent in terms of the heat radiation. Moreover, since the reflective ultraviolet LED 51 does not require resin encapsulation, even if the aluminum vapor deposition and the silicon dioxide vapor deposition are layered on the alumina reflection mirror body 55 to form the reflection mirror 65a, it does not affect the mass-production.

Since the reflection surface 55a of the reflection mirror 55 is made of the aluminum vapor deposition and the silicon dioxide vapor deposition, it has high reflectance efficiency at a wavelength zone from the visible light to the ultraviolet light. Particularly, the reflectance efficiency of the silver becomes very low at the zone of the ultraviolet rays emitted from the fourth embodiment of the LED element 52. In contrast, the reflection mirror 55 can get high reflectance efficiency for the ultraviolet rays that cannot be obtained by the widely used silver plating.

The reflection mirror 55 is formed into substantially a paraboloid of revolution that has a focal point at the position of the LED element 52. Accordingly, at the reflection mirror 55, all the ultraviolet rays emitted from the LED element 52 are reflected in a direction that is parallel to an axis of the parabolic surface of revolution. The radiation portion 56 made of the glass plate is located in such direction. The surface roughness of the radiation portion 56 can be easily made into a surface roughness of an optical level. Therefore, there is no scattering of the ultraviolet rays generated at the radiation portion 56, either. The ultraviolet rays reflected at the reflection mirror 55 are radiated from the radiation portion 56 in the same direction.

Thereby, the reflective LED 51 can control substantially all luminous flux of the ultraviolet light emitted from the LED element 52 and radiate the light to the outside. Therefore, the LED 51 has high external radiant efficiency and can provide many choices in design of the light radiation property such as the light distribution property. Moreover, since the fourth embodiment of the reflective LED 51 is not encapsulated with a synthetic resin, there is no problem of degradation of the resin caused by the ultraviolet light or short wavelength light in the visible light. Consequently, the LED 51 can realize high luminous intensity, thereby providing the reflective ultraviolet LED that can be put into practice. In order to prevent degradation of the LED element 52 due to humidity that may be caused by the structure in which the LED element 52 is not encapsulated, it is enough to seal the inside of the reflective LED 51 with dry nitrogen.

Fifth Embodiment

Figure 13:
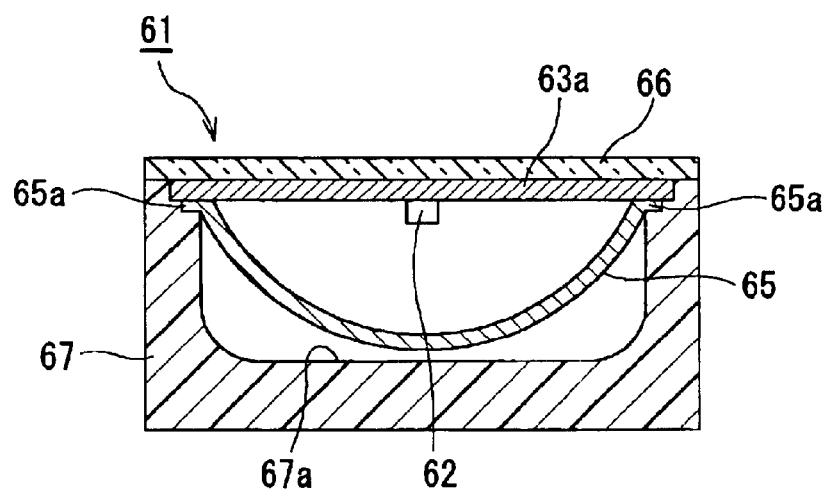
FIG. 13 is a cross-section taken along the line XIII—XIII of FIG. 12.
Figure 14:
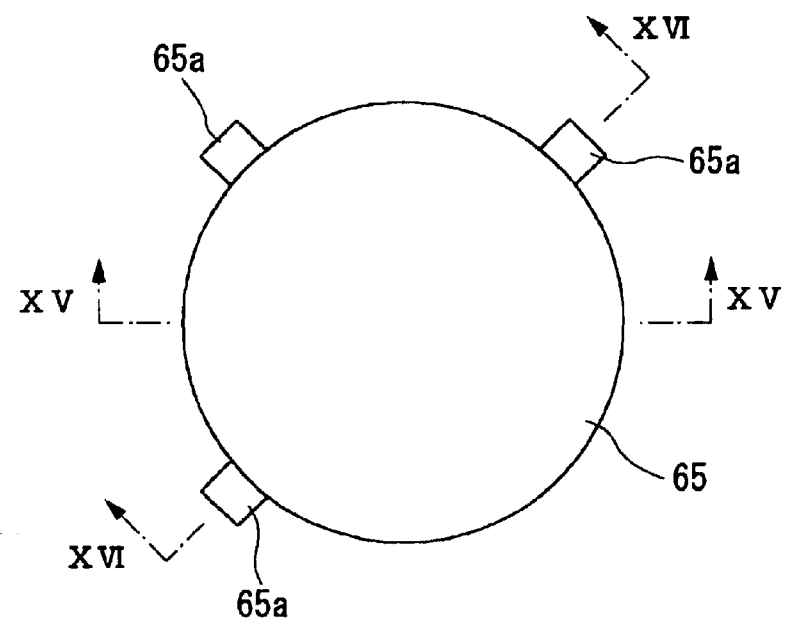
FIG. 14 is a plan view showing a construction of a reflection plate of the reflective LED according to the fifth embodiment of the invention.
Figure 15:
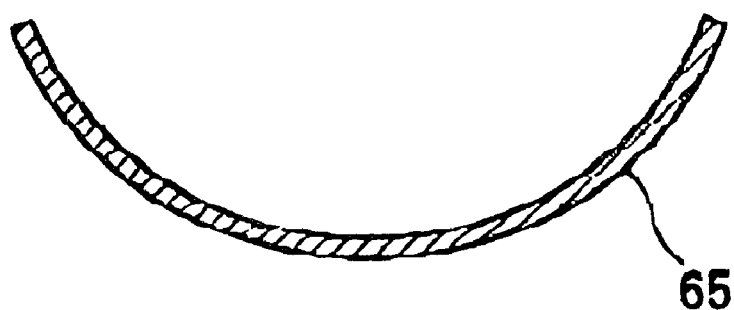
FIG. 15 is a cross-section taken along the line XV—XV of FIG. 14.
Figure 16:
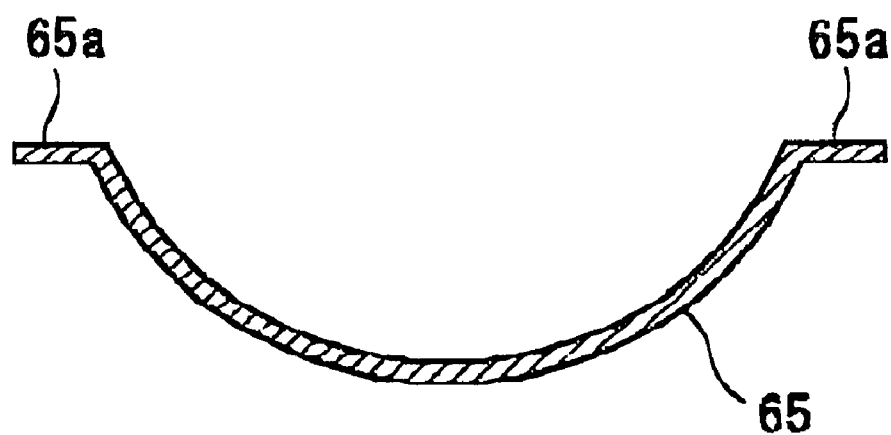
FIG. 16 is a cross-section taken along the line XVI—XVI of FIG. 14.

A fifth embodiment of the invention is described referring to FIG. 12 to FIG. 16. FIG. 12 is a plan view showing an overall construction of a reflective LED according to a fifth embodiment of the invention. FIG. 13 is a cross-section taken along the line XIII—XIII of FIG. 12. FIG. 14 is a plan view showing a construction of a reflection plate of the reflective LED according to the fifth embodiment of the invention. FIG. 15 is a cross-section taken along the line XV—XV of FIG. 14. FIG. 16 is a cross-section taken along the line XVI—XVI of FIG. 14.

As shown in FIG. 12 and FIG. 13, a fifth embodiment of a reflective LED 61 has a pair of leads 63a and 63b for supplying an electric power to an LED element 62 that emits ultraviolet light. The LED element 62 is mounted on a lower surface of the one lead 63a. A wire 64 bonds the other lead 63b and the LED element 62 to electrically connect them. Thus, a lead portion is constructed. A reflection mirror 65 is formed into a concave surface shape by pressing an aluminum plate. A glass plate 66 constitutes a radiation portion. The lead portion 63a, 63b, the reflection mirror 65 and the glass plate 66 are assembled to a base 67 made of a synthetic resin. In the fifth embodiment of the reflective LED 61, the base 67 has four recesses or dents in which the pair of the leads 63a, 63b is fitted. Then, the glass plate 77 as the radiation portion is fixed by adhesion from their upper side.

The fifth embodiment of the reflective LED 61 has a heat-conducting portion 65a for conducting heat from the one lead 63a on which the LED element 62 is mounted. The head-conducting portion 65a is not provided so as to surround the reflection mirror along the whole outer circumference of the reflection mirror 5, 15, 25, 35, 45, 55 as in the first to fourth embodiments. The head-conducting portion 65a has a protruded shape that is provided only at a location corresponding to the lead 63a in the reflection mirror 65. That is, three protrusions 65a as the heat-conducting portions are integrally formed at positions facing the lead 63a in an outer circumference of the reflection mirror 65, respectively, so as to have a plate shape protruding substantially in a radial direction from the outer circumference of the reflection mirror 65.

The reflection mirror 65 is housed in a housing space 67a of the base 67. The reflection mirror 65 is attached to the base 67, while the protrusions 65a are fitted on a stepped portion that is formed on an upper end side of the housing space 67a of the base 67. The glass plate 66 is fixed by adhesion to the base 67, while fitted on a large diameter stepped portion that is formed on an upper side than the stepped portion for the protrusions 65a of the base 67. As in the case of the fourth embodiment of the reflection mirror 55, the base 67 has three recesses or dents formed at its outer circumference in which the pair of the lead 63a and 63b is fitted. Then, the glass plate 66 as the radiation portion is fixed by adhesive from an upper side of them so as to complete the reflective LED 61.

As in the first and second embodiments, the reflection mirror 65 uses an aluminum plate with a linear reflectance of 85% which is fabricated by such a working method as not to cause a trace of a roll at the time of rolling. Moreover, a consideration is taken so as to keep such surface roughness thereof. The reflection mirror 65 is formed into a concave shape of substantially a paraboloid of revolution that has a solid angle of $2\pi$ steradian in relation to the LED element 62 and that has a focal point at the position of the LED element 62. Accordingly, at the reflection mirror 65, all the ultraviolet light emitted from the LED element 62 becomes a reflected light that is parallel to an axis of the parabolic surface of revolution. Then, the light is radiated from the radiation portion 66 at the back of the LED element 62.

In the fifth embodiment, as in the third embodiment, an oxidation treatment is provided on a front surface of the reflection mirror 45 of aluminum, thereby forming an insulating layer of alumite on the front surface. Since the insulation layer is provided over the surface of the reflection mirror 65, though the pair of the leads 63a and 63b is contacted directly with the reflection mirror 65, the leads 63a and 63b are never short-circuited.

Since the reflection mirror 65 is made of the aluminum plate, it has high reflectance efficiency at a wavelength zone from the visible light to the ultraviolet light. There is no need for plating. Particularly, the reflectance efficiency of the silver becomes very low at the zone of the ultraviolet rays emitted from the fifth embodiment of the LED element 62. In contrast, the reflection mirror 65 made of aluminum can get high reflectance efficiency for the ultraviolet rays that cannot be obtained by the widely used silver plating.

The reflection mirror 65 is formed into substantially a paraboloid of revolution that has a focal point at the position of the LED element 62. Accordingly, at the reflection mirror 65, all the ultraviolet rays emitted from the LED element 62 are reflected in a direction that is parallel to an axis of the parabolic surface of revolution. The radiation portion 66 made of the glass plate is located in such direction. The surface roughness of the radiation portion 66 can be easily made into a surface roughness of an optical level. Therefore, there is no scattering of the ultraviolet rays at the radiation portion 66, either. The ultraviolet rays reflected at the reflection mirror 65 are radiated from the radiation portion 66 in the same direction.

Thereby, the reflective LED 61 can control substantially all luminous flux of the ultraviolet light emitted from the LED element 62 and radiate the light to the outside. Therefore, the LED 61 has high external radiant efficiency and can provide many choices in design of the light radiation property such as the light distribution property. Moreover, since the fifth embodiment of the reflective LED 61 is not encapsulated with a synthetic resin, there is no problem of degradation of the resin caused by the ultraviolet light or short wavelength light in the visible light. The one lead 63a is directly contacted with the reflection mirror 65. Accordingly, heat of the LED element 62 is released from the entire reflection mirror 65 while conducted from the lead 63a to the reflection mirror 65. Thus, the LED 61 is very much excellent in terms of the heat radiation. Consequently, the LED 61 can realize high luminous intensity, thereby providing the reflective ultraviolet LED that can be put into practice.

Sixth Embodiment

Figure 17:
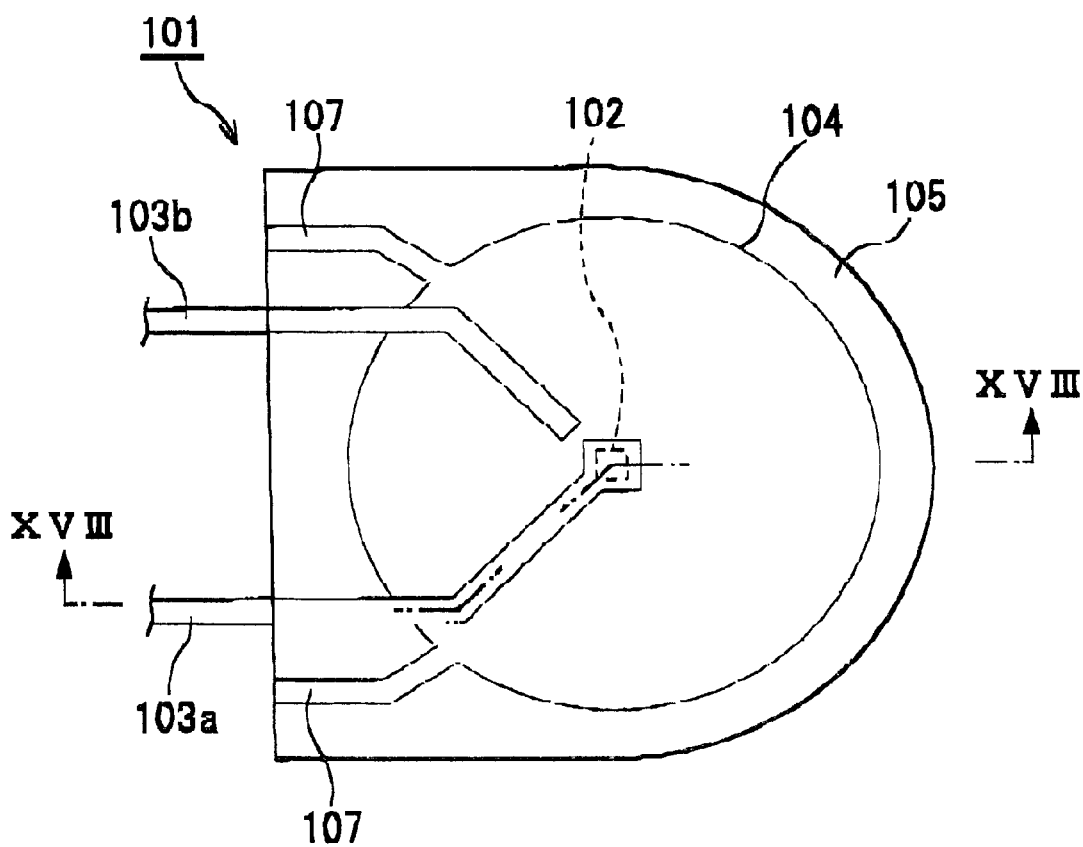
FIG. 17 is a plan view showing an overall construction of a reflective LED according to a sixth embodiment of the invention.
Figure 18:
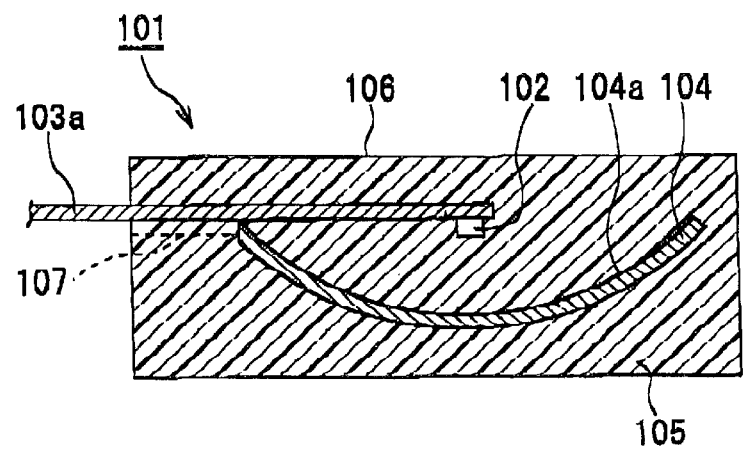
FIG. 18 is a cross-section taken along the line XVII—XVII of FIG. 17.

A sixth embodiment of the invention is described referring to FIG. 17 and FIG. 18. FIG. 17 is a plan view showing an overall construction of a reflective LED according to a sixth embodiment of the invention. FIG. 18 is a cross-section taken along the line XVIII—XVIII of FIG. 17.

As shown in FIG. 17 and FIG. 18, a sixth embodiment of a reflective LED 101 has a pair of leads 103a and 103b for supplying an electric power to an LED element 102. The LED element 102 is mounted on a lower surface of a leading end of the one lead 103a. A wire (not shown) bonds the other lead 103b and the LED element 102 to electrically connect them. A reflection mirror 104 is formed into a concave surface shape by pressing a brass plate and plating a silver thereon. The reflection mirror 104 as a reflection member is attached to the leads 103a, 103b. A transparent epoxy resin 105 encapsulates the leads 103a, 103b and the reflection mirror 104 as a whole. At the same time, a flat shape of a light radiation surface 106 is molded on a surface of the epoxy resin 105 at a back of the LED element 102.

The LED element 102 emits a green light. The lead 103a, 103b is made of a copper alloy plate of 0.3 mm thick on which a silver is plated. The leads 103 and 103b are drawn out from one side of the reflection mirror 104 and the encapsulating resin 105. The encapsulation of the epoxy resin 105 is carried out by a potting mold. That is, since both the leads 103a and 103b are drawn out from one side of the epoxy resin 105, the encapsulation by the potting mold becomes possible. In case of the potting mold, more choices of the encapsulating materials to be selected are provided compared with the transfer mold, so that an epoxy resin that is hard to become yellowed is used as the transparent epoxy resin 105.

The reflection mirror 104 uses a brass plate of 0.2 mm thick with a linear reflectance of 85% which is fabricated by such a working method as not to cause a trace of a roll at the time of rolling. Moreover, a consideration is taken so as to keep such surface roughness thereof. The reflection mirror 104 is formed into a concave shape of substantially a paraboloid of revolution so that its reflection surface 104a has a solid angle of $2\pi$ steradian in relation to the LED element 102 and so that has the reflection surface 104a has a focal point at the position of the LED element 102. Furthermore, a silver is plated on a surface of the concave shape. Thereby, the linear reflectance of 85% is obtained. Accordingly, at the reflection surface 104a, all the light emitted from the LED element 102 becomes a reflected light that is parallel to an axis of the parabolic surface of revolution. Then, the light is radiated from the light radiation surface 106 at the back of the LED element 102. Since the reflection mirror 104 is made of the brass plate, it can be laid over a lead frame having the leads 103a and 103b formed thereon, thereby facilitating a positioning work of the LED element 102 and the reflection mirror 104. Moreover, it is possible to manufacture a series of reflection mirrors at once, so that it is excellent in mass-productivity. At this time, the reflection mirror 104 is formed by plating the silver on the brass plate, so that it is not affected by the heat at the time of the encapsulation and the leads and a machine for the production are never damaged.

The reflection mirror 104 has the solid angle of $2\pi$ steradian in relation to the LED element 102 and is disposed not only at a location in a direction of a center axis of the LED element 102 but also at a location in a lateral direction of the LED element 102. Therefore, the reflection mirror 104 provides high light condensation/radiation efficiency and has little dislocation of the axis. Since the sixth embodiment uses the reflection mirror 104 of the silver-plated brass, the LED 101 can endure the process in the reflow furnace for surface mounting and can be miniatured. The LED 101 can encapsulate the leads 103, 103b and so on by the potting mold, so that a metal mold can be fabricated easily. Moreover, an encapsulating a material resistant to yellowing can be used. Since it is only the light radiation surface 106 that should be formed as an optical surface, choices of manufacturing methods increase. Thus, the LED 101 can be a reflective optical device that is excellent in mass-productivity.

While the one lead 103a is contacted with the reflection mirror 104, a lower surface of the other lead 103b is half-etched, so that a gap is formed between the other lead 103b and the reflection mirror 104, thereby providing insulation therebetween. Therefore, the one lead 103b and the other lead 103b are never short-circuited through the reflection mirror 104. In consideration of migration of the silver, the lead 103b is used as a cathode. The above-mentioned potting mold has been used conventionally for production of a lens LED. In the sixth embodiment of the reflective LED 101, the reflection mirror 104 as the reflection member is embedded. Therefore, some treatment is necessary to prevent short circuit of the one lead 103a and the other lead 103b via the reflection mirror 104, for example.

Figure 19:
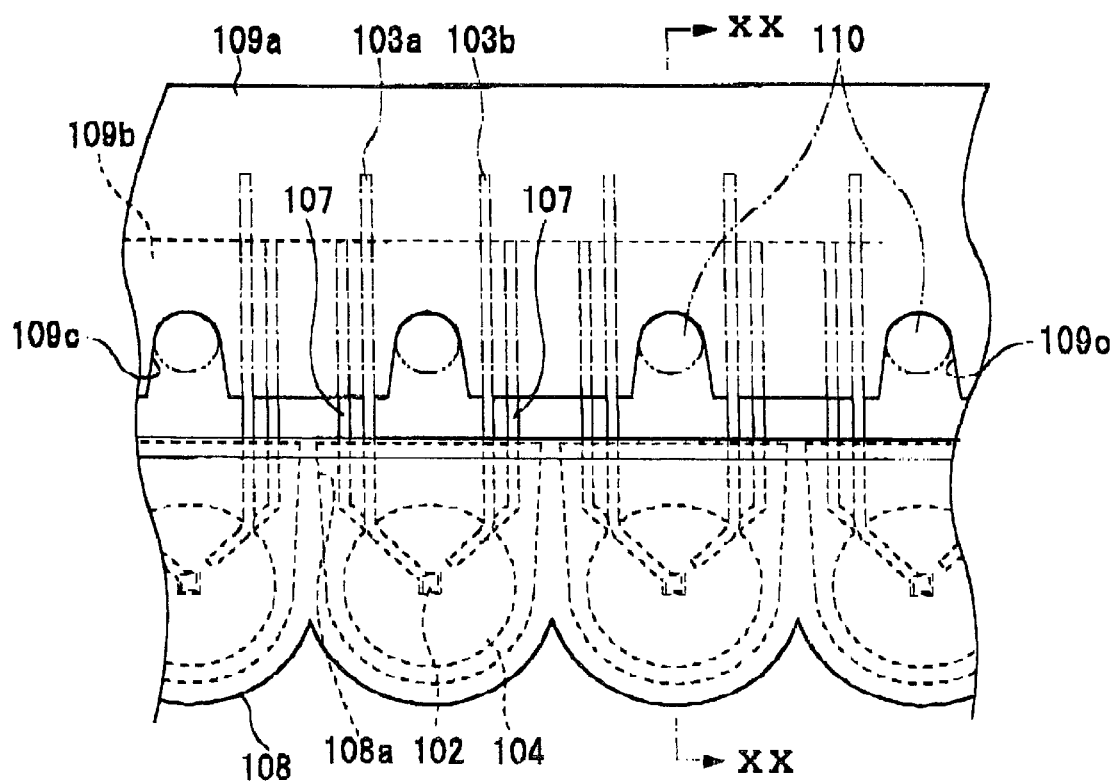
FIG. 19 is a front elevation showing a manufacturing method of the reflective LED according to the sixth embodiment of the invention.
Figure 20:
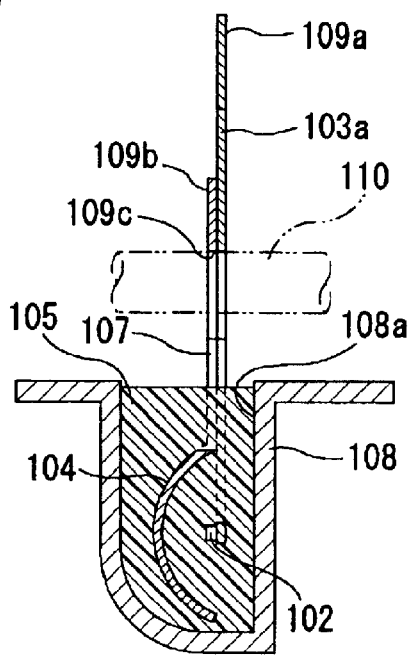
FIG. 20 is a cross-section taken along the line XX—XX of FIG. 19.

Next, a manufacturing method of the sixth embodiment of the reflective LED 101 is described referring to FIG. 19 and FIG. 20. FIG. 19 is a front elevation showing a manufacturing method of the reflective LED according to the sixth embodiment of the invention. FIG. 20 is a cross-section taken along the line XX—XX of FIG. 19.

As shown in FIG. 19, many molds 103 for the potting mold are successively arranged and connected in a horizontal direction on a belt conveyor (not shown). The mold 108 has a hollow pot 108a inside thereof. Set in the pot 108a are the leads 103a and 103b extending from a lead frame 109a, a pair of reflection mirror supports 107 extending from a reflection member 109b, the reflection mirror 104 supported on a leading end of the support 107 and the LED element 102 mounted on the lead 103a. Thereafter, a space of the pot 108 is filled with the transparent epoxy resin 105 as a liquid encapsulating material.

In order to set these members in the pot 108a, plural or many support rods 110 are hooked on recesses or dents that are provided at constant intervals on a lower end of the lead frame 109a and the reflection member 109b, respectively. Then, the support rods 110 are moved down simultaneously. Thereafter, the space of the pot 108a is filled with the liquid encapsulating material or the epoxy resin 105. Then, the belt conveyor moves in a direction perpendicular to a paper plane of FIG. 19, the pots 108 pass through a heating zone together with the lead frame 109a and the reflection member 109b. Thereby, the epoxy resin in the pot 108a is hardened, thereby encapsulating the LED element 102, the leads 103a and 103b, the reflection mirror 104, the reflection mirror support 107 and so on in the pot 108a, as shown in FIG. 20. Then, the support rods 110 are moved upward so as to take out the hardened epoxy resins from the pots 108a. Thereafter, the leads 103 and 103b are taken out from the lead frame 109a. The reflection mirror supports 107 are cut away at the front surface of the epoxy resin 105. Thus, the reflective LED 101 is finished as shown in FIG. 17 and FIG. 18. While the LEDs 101 are separated one by one as described above, it is possible to keep plural LEDs 101 connected through the lead frame 109a without separation after taken out from the mold 108. In this case, there is provided a reflective LED block that has plural LEDs 101 connected in series so as to light the LEDs 101 at once.

The production becomes easy with the potting mold, however, it is difficult to improve location accuracy between the leads and the mold shape. Therefore, in case of the lens LED, the light distribution property varies due to the positional accuracy of the LED element and a lens surface. However, in the sixth embodiment, the angle of the light radiation surface 106 is constant in relation to the center axis of the reflection surface 104 as long as the LED element 102 is located at the fixed position relative to the reflection mirror 104, as shown in FIG. 20, regardless if the LED element 102 and the reflection mirror 104 enter into the pot 108a a little deeper or shallower. Then, there is no axial dislocation in terms of optics. Owing to such configuration and the shape of the reflection mirror 104 in combination, the LED 101 becomes a reflective LED that is provided with excellent and stable light distribution property. Since the plural reflection mirrors 104 are formed successively on the aluminum plate, it is possible to manufacture the LED 101 that is excellent in the mass-productivity as in the production of the lens LED.

Since the leads 103a and 103b are taken out from or to one side of the LED element 102, it is possible to avoid bubbles from remaining in the reflection mirror 104 at the time of encapsulation by the resin. Therefore, it is possible to improve yield at the time of production.

As described above, the sixth embodiment of the reflective LED is manufactured by the potting mold, so that the metal mold is not required of high accuracy and can be fabricated easily. Moreover, it can deal with an LED having a different specification of light distribution by changing the shape of the reflection mirror 104. Therefore, it is unnecessary to fabricate the metal mold each time the specification is changed. Since the LED uses the reflection mirror 104 of silver coated brass plate, it is strong in temperature change. Moreover, there is no possibility that the reflection mirror 104 never loses the function as the reflection mirror, though there is such possibility in the conventional reflective LED 331 due to the vapor-deposited metal being peeled off from the encapsulating resin 336. Therefore, the LED can endure the process in the reflow furnace in which the temperature changes a great deal. Thus, the LED is suitable as the reflective LEDs that can be surface-mounted easily. No lead extracting portions 337a and 337b are necessary as in the conventional reflective LED 331, so that it can be miniatured easily and suitable for high-density mounting. Since the potting mold has more choices in selecting the encapsulating resin to be used than the transfer mold, the reflective LED can have long life by using an encapsulating resin that is hard to be yellowed.

Seventh Embodiment

Figure 21:
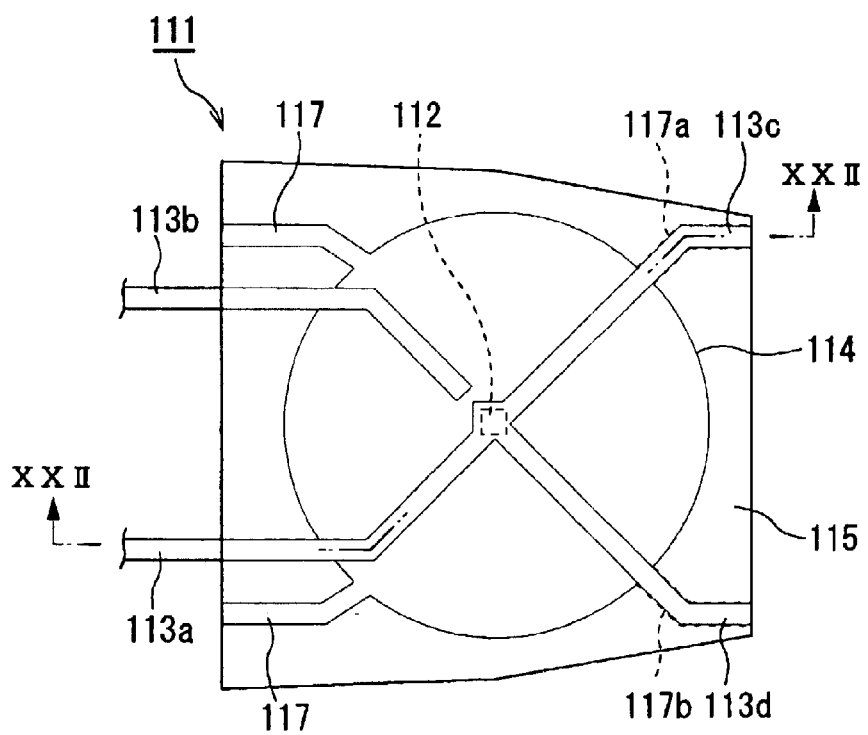
FIG. 21 is a plan view showing an overall construction of a reflective LED according to a seventh embodiment of the invention.
Figure 22:
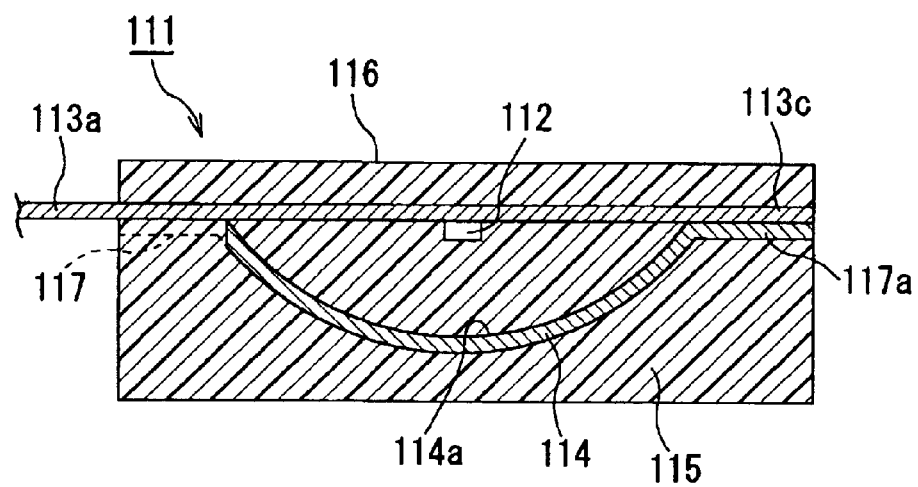
FIG. 22 is a cross-section taken along the line XXII—XXII of FIG. 20.

A seventh embodiment of the invention is described referring to FIG. 21 and FIG. 22. FIG. 21 is a plan view showing an overall construction of a reflective LED according to a seventh embodiment of the invention. FIG. 22 is a cross-section taken along the line XXII—XXII of FIG. 20.

As shown in FIG. 21 and FIG. 2, a seventh embodiment of a reflective LED 111 is different from the sixth embodiment in that a pair of reflection mirror supports 117a and 117b as reflection member supports is connected to another side (leading end side) of the reflection mirror 114. Moreover, a lead 113a is branched into two that extend from a position at which an LED element 112 is mounted, thereby constituting leads 113c and 113d. At leading end portions, the reflection mirror support 117a and the lead 113c as well as the reflection mirror support 117b and the lead 113d are overlapped, respectively. Furthermore, a mold for potting the reflective LED 111 has a taper at its leading end, as shown in FIG. 21. Thereby, the leading end portion of the lead 113a and the lead 113c are pressed to the reflection mirror support 117a, while the lead 113d is pressed to the reflection mirror support 117b, as the fixed leads 113 and 113b and the reflection mirror 114 are inserted into the mold in the same way as FIG. 19 and FIG. 20. Then, the leads 113, 113c and 113d and the border of the reflection mirror 114 are contacted tightly at three positions. Thus, the LED element 112 is secured more surely and strongly to a focal point of a reflection surface 114a that has a shape of a paraboloid of revolution.

In the same manner as the sixth embodiment, a lower surface of the other lead 113b is half-etched, so that a gap is formed between the other lead 113b and the reflection mirror 114, thereby providing insulation therebetween. The reflection mirror 114 uses an aluminum plate of 0.2 mm thick with a linear reflectance of 85% which is fabricated by such a working method as not to cause a trace of a roll at the time of rolling. Moreover, a consideration is taken so as to keep such surface roughness thereof. The reflection mirror 114 is formed into a concave shape of substantially a paraboloid of revolution so that the reflection surface 114a has a solid angle of $2\pi$ steradian in relation to the LED element 112 and so that has the reflection surface 114a has a focal point at the position of the LED element 112.

Detailed description of the structure, function and effects that are similar to those of the sixth embodiment is omitted.

As described above, in the seventh embodiment of the reflective LED 111, the LED element 112 is surely located at the center of the reflection mirror 114, so that it has high light condensation/reflection efficiency and that there is little axial dislocation. Since the aluminum reflection mirror 114 is used, the LED can endure the process in the reflow furnace for surface mounting and be miniatured. Since it is encapsulated by the potting mold, it is easy to fabricate the mold and it can use an encapsulating material that is hard to be yellowed. Since it is only a light radiation surface 116 that needs to be formed as an optical surface, the choices in the manufacturing method increase. Moreover, in addition to these advantages, it is possible to improve the positional accuracy of the reflection mirror 114 relative to the LED element 112. Furthermore, it can eliminate a secondary machining for mirror finishing and corrosion preventing management of the plating or the like. Therefore, the LED has more stable optical property and can be a reflective optical device that is excellent in mass-productivity.

Eighth Embodiment

Figure 23:
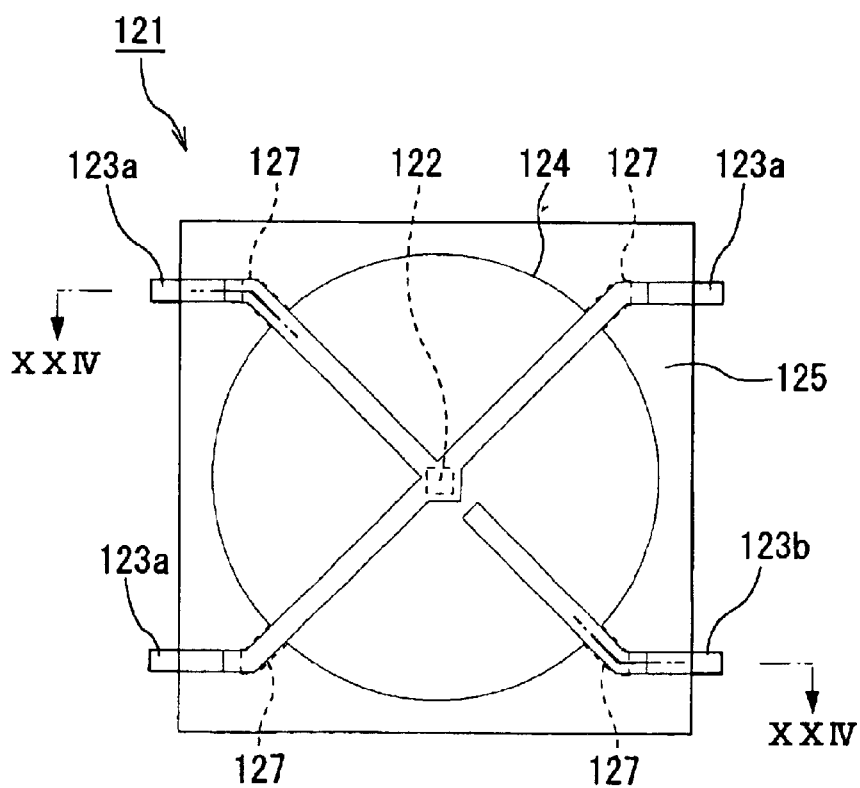
FIG. 23 is a plan view showing an overall construction of a reflective LED according to an eighth embodiment of the invention.
Figure 24:
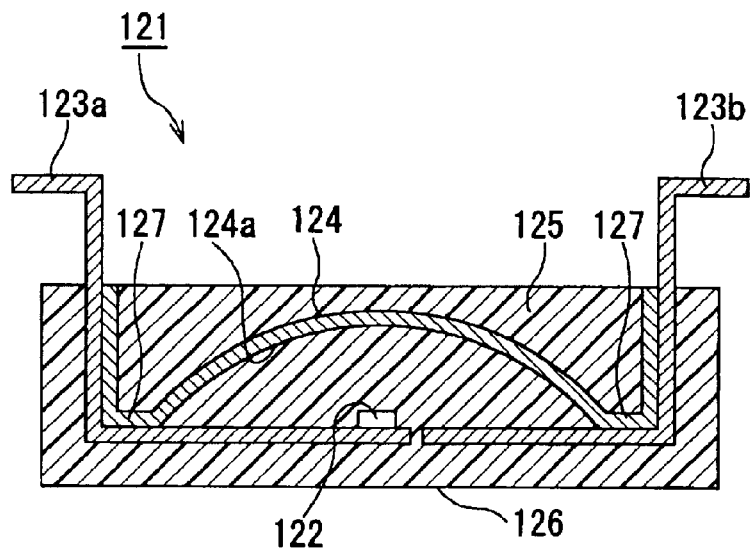
FIG. 24 is a cross-section taken along the line XXIV—XXIV of FIG. 23.

An eighth embodiment of the invention is described referring to FIG. 23 and FIG. 24. FIG. 23 is a plan view showing an overall construction of a reflective LED according to an eighth embodiment of the invention. FIG. 24 is a cross-section taken along the line XXIV—XXIV of FIG. 23.

An eight embodiment is different from the sixth and seventh embodiments in a extracting direction of leads and an insulating method between the leads and a reflection member.

As shown in FIG. 23 and FIG. 24, the eighth embodiment of the reflective LED 121 has a pair of leads 123a and 123b for supplying an electric power to an LED element 122. The LED element 122 is mounted on an upper surface of the one lead 123a. A wire (not shown) bonds the other lead 123b and the LED element 122 to electrically connect them. The leads 123a and 123b are bent substantially at right angles and extracted upward. Since the leads 123a and 123b are extracted in one direction as mentioned above, an encapsulation by the potting mold becomes possible. A reflection mirror 124 as the reflection member is formed into a concave surface shape by pressing an aluminum plate. The reflection mirror 124 is attached such that reflection mirror supports 127 extending in four directions are overlapped with the leads 123*a* and 123*b*, respectively. Then, a transparent epoxy resin 125 encapsulates the reflection mirror 124 as a whole. At the same time, a flat shape of a light radiation surface 126 is molded on a surface of the epoxy resin 125 at a back of the LED element 122.

An insulating sheet is held between the other lead 123*b* and the reflection mirror 124 over an entire surface thereof. Then, the other lead 123*b* and the reflection mirror 124 are insulated, so that the one lead 123*a* and the other lead 123*b* are never short-circuited via the reflection mirror 124.

In the eight embodiment, the leads 123*a* and 123*b* are extracted upward while bent substantially at right angles, respectively. Therefore, after the leads 123*a* and 123*b* and the reflection mirror 124 are encapsulated by the potting mold, the leads 123*a* and 123*b* are bent along the upper surface of the transparent epoxy resin 125, as shown in FIG. 24, so that the LED can be surface-mounted thereafter. The upper surface of the epoxy resin 125 corresponds to a front surface of the transparent epoxy resin 125 at the time of potting mold. As described above, the eighth embodiment of the reflective LED 121 becomes a reflective optical device that can be easily surface-mounted.

As described above, in the eighth embodiment of the reflective LED 121, the surface mounting becomes easy and the LED element 112 is surely located at the center of the reflection mirror 114. Therefore, the LED 121 has high light condensation/reflection efficiency and that there is little axial dislocation. Since the aluminum reflection mirror 124 is used, the LED 121 can endure the process in the reflow furnace for surface mounting and be miniatured. Since it is encapsulated by the potting mold, it is easy to fabricate the mold and it can use an encapsulating material that is hard to be yellowed. Since it is only a light radiation surface 126 that needs to be formed as an optical surface, the choices in the manufacturing method increase and the LED 121 can be a reflective optical device that is excellent in mass-productivity.

Ninth Embodiment

Figure 25:
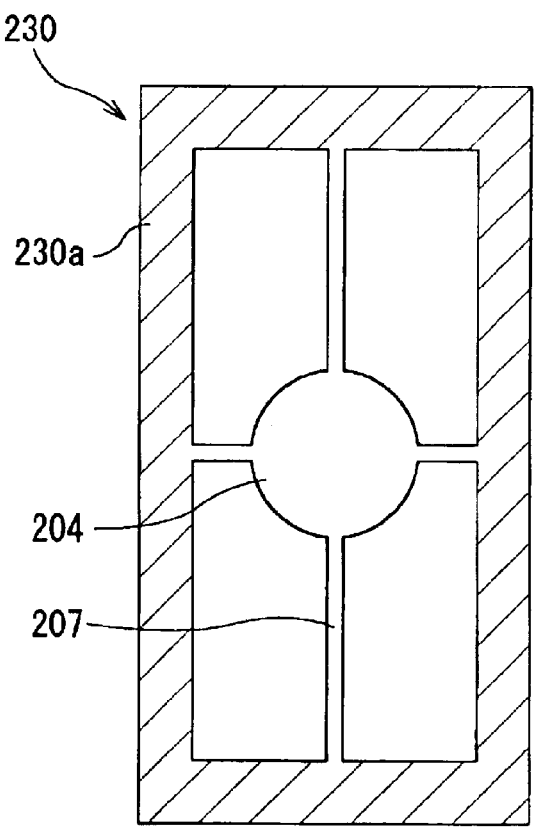
FIG. 25 is a plan view showing a structure of a reflection member for fabricating a reflective LED according to a ninth embodiment of the invention.
Figure 26:
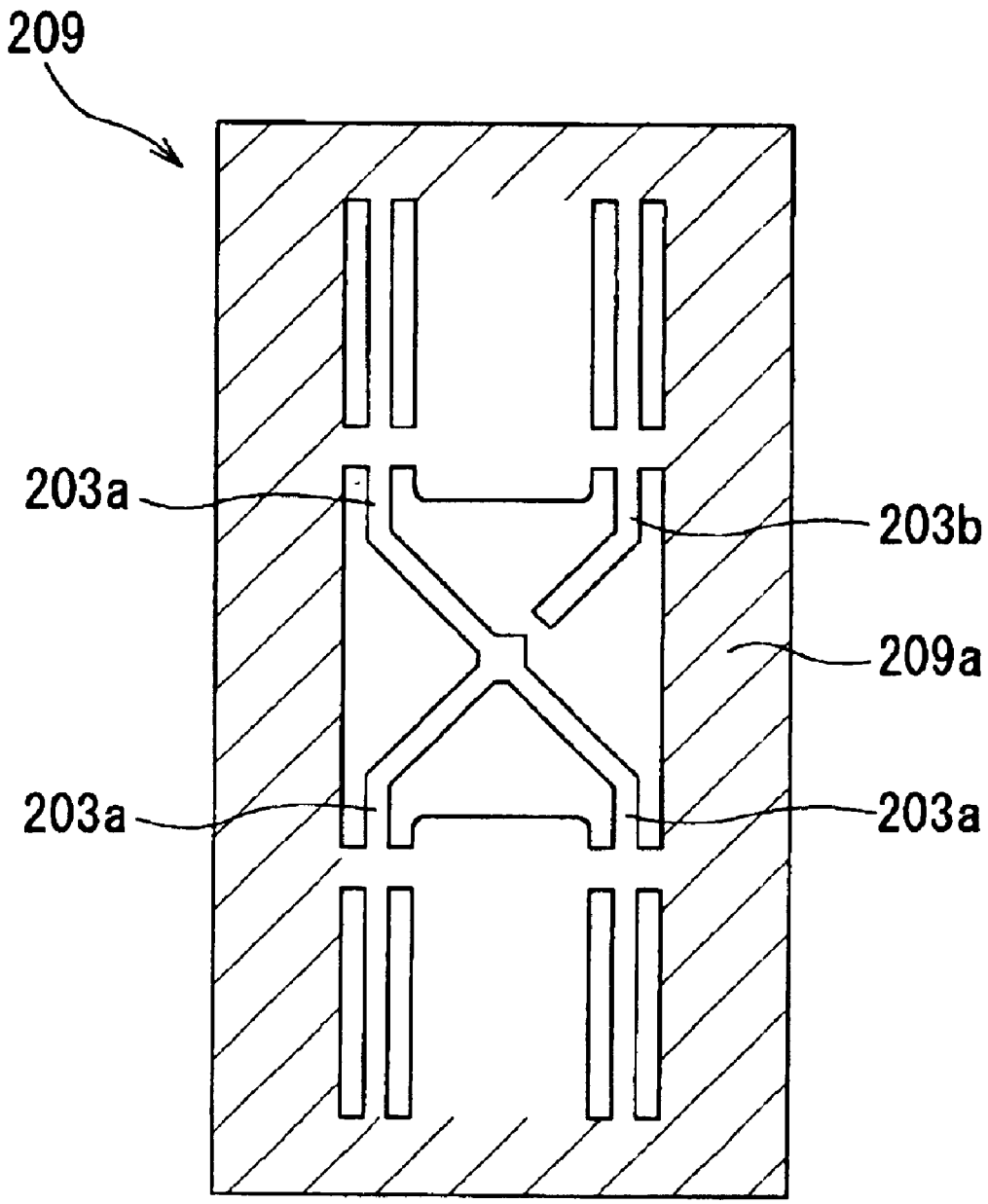
FIG. 26 is a plan view showing a structure of a lead frame for fabricating the reflective LED according to the ninth embodiment of the invention.
Figure 27:
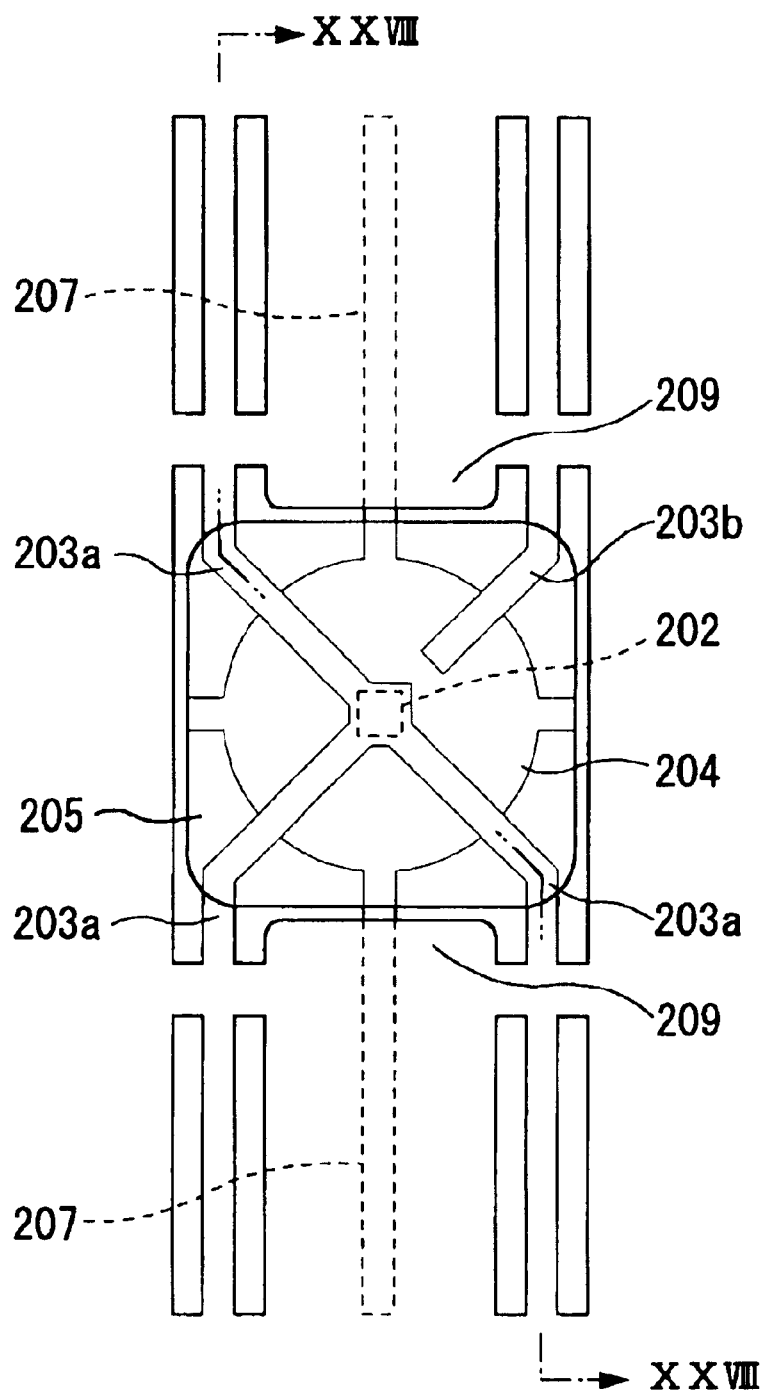
FIG. 27 is a plan view showing a manufacturing method of the reflective LED according to the ninth embodiment of the invention.
Figure 28:
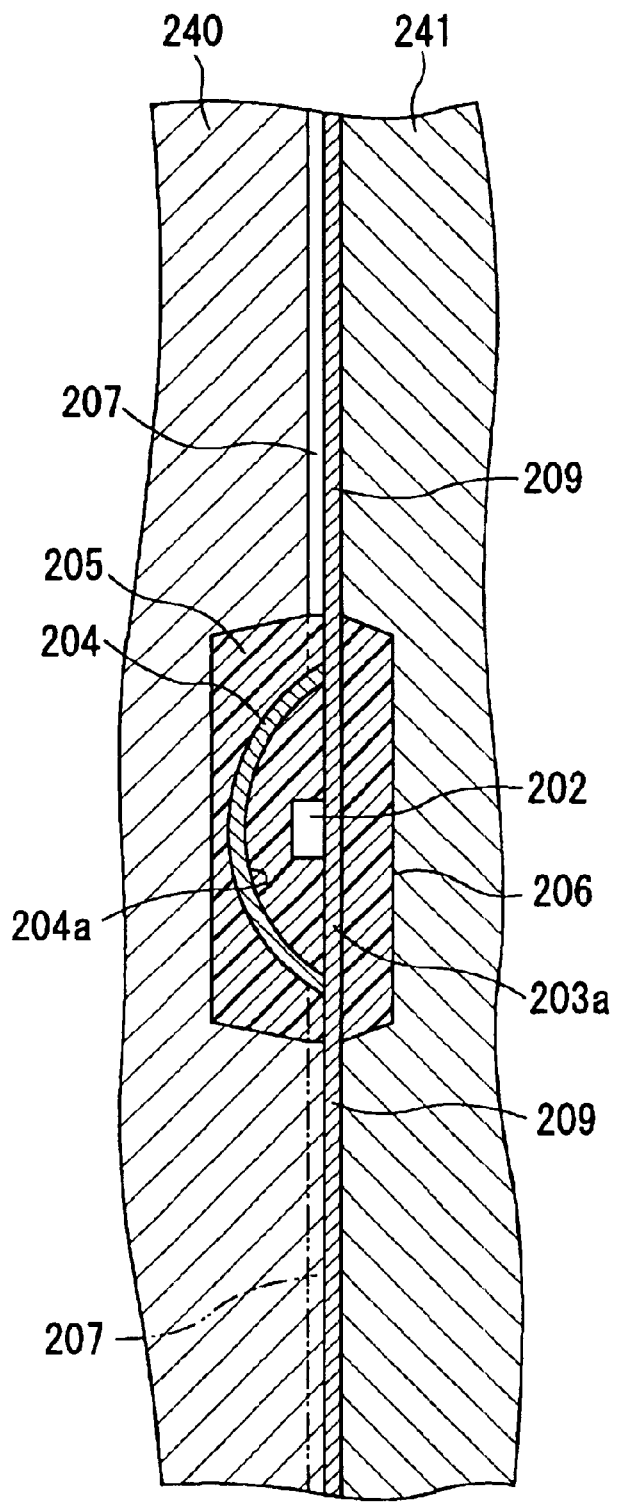
FIG. 28 is a cross-section taken along the line XXVIII—XXVIII of FIG. 27.
Figure 29:
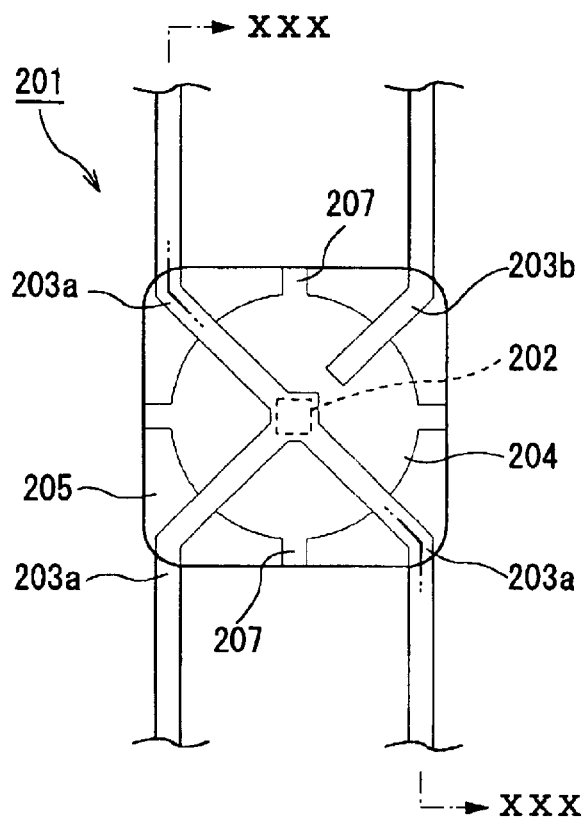
FIG. 29 is a plan view showing the reflective LED according to the ninth embodiment of the invention.
Figure 30:
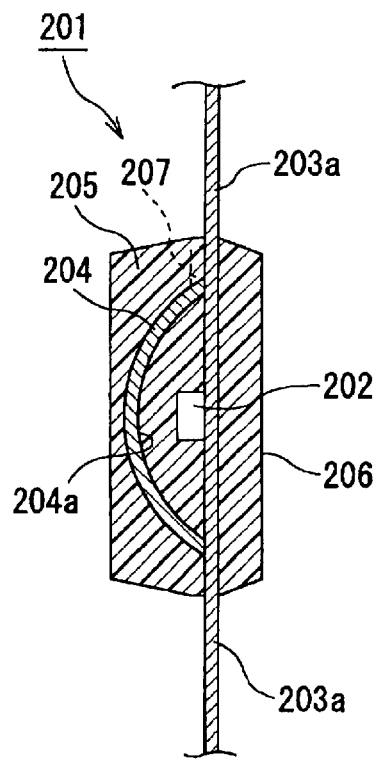
FIG. 30 is a cross-section taken along the line XXX—XXX of FIG. 29.

A ninth embodiment of the invention is described referring to FIG. 25 to FIG. 30. FIG. 25 is a plan view showing a structure of a reflection member for fabricating a reflective LED according to a ninth embodiment of the invention. FIG. 26 is a plan view showing a structure of a lead frame for fabricating the reflective LED according to the ninth embodiment of the invention. FIG. 27 is a plan view showing a manufacturing method of the reflective LED according to the ninth embodiment of the invention. FIG. 28 is a cross-section taken along the line XXVIII—XXVIII of FIG. 27. FIG. 29 is a plan view showing the reflective LED according to the ninth embodiment of the invention. FIG. 30 is a cross-section taken along the line XXX—XXX of FIG. 29.

As shown in FIG. 25 and FIG. 26, as a material for manufacturing a ninth embodiment of a reflective LED, a reflection member 230 is prepared. The reflection member 230 has a reflection mirror 204 formed at its center portion by pressing and punching an aluminum plate having high linear reflectance. The center reflection mirror 204 and a reflection member border portion 230*a* are supported and connected by four reflection mirror supports 207. A silver-plated lead frame 209 has leads 203*a* and 203*b* formed at its center portion by punching a copper alloy plate. The lead frame 209 is provided with a lead frame border portion 209*a* at its outer circumference, too. The reflection member 230 and the lead frame 209 are laid over each other to manufacture the reflection LED. Specifically, the reflection mirror 204 is supported on the reflection member border portion 230*a* through the reflection mirror support 207 and overlapped with the lead 203*a* that has an LED element 202 mounted thereon and the lead 203*b*. In such state, they are set in a transfer metal mold and encapsulated with a synthetic resin. The reflection member border portion 230*a*, the lead frame border portion 209*a* and the metal mold are overlapped without any gap at hatched section in FIG. 25 and FIG. 26. Therefore, the encapsulating resin is stopped inside the hatched section.

Next, a specific manufacturing method of the reflective LED is described referring to FIG. 27 and FIG. 28.

As shown in FIG. 27 and FIG. 28, in the manufacturing method of the ninth embodiment of the reflective LED, the LED element 202 is mounted on a center of a lower surface of the one lead 203*a* in the leads 203*a* and 203*b* for supplying an electric power to the LED element 202. A wire (not shown) bonds the other lead 203*b* and the LED element 202 to electrically connect them. The reflection mirror 204, which is formed into concave shape by pressing the aluminum plate, is placed on a lower mold 240 of the transfer metal mold via the reflection member 230 to which the reflection mirror 204 is connected via the reflection mirror supports 207. The lead frame 209 is laid over the reflection member 230. Then, a position of the lead frame 209 is adjusted such that the LED element 202 mounted on the lead 203*a* is located so as to face the center of the reflection mirror 204. Thereafter, an upper mold 241 is faced on the lower mold 240 and the metal mold is closed to perform the transfer molding. FIG. 27 and FIG. 28 show a state after the transfer molding. The transparent epoxy resin 205 encapsulates the leads 203*a* and 203*b* and the reflection mirror 204 as a whole. At the same time, a flat shape of a light radiation surface 206 is molded on a surface of the epoxy resin 205 at a back of the LED element 202.

FIG. 29 and FIG. 30 show the reflective LED 201 as a product. As described above, the epoxy resin 205 is kept back at the hatched portions of the reflection member 230 and the lead frame 209 of FIG. 25 and FIG. 26, namely, at the reflection member border portion 230*a* and the lead frame border portion 209*a*. However, punched or trimmed areas or hollows of the reflection member 230 and the lead frame 209 are filled with the epoxy resin 205. Then, burrs are produced after the epoxy resin 205 is hardened at such hollows. Therefore, these burrs are removed and the leads 203*a* and 203*b* are cut away from the lead frame 209, and the lead frame 209 is taken away. On the other hand, the upper and lower reflection mirror supports 207 are cut away at an end surface of the epoxy resin 205. Thus, the reflective LED 201 shown in FIG. 29 and FIG. 30 is obtained.

The reflection mirror 204 uses an aluminum plate of 0.2 mm thick with a linear reflectance of 85% which is fabricated by such a working method as not to cause a trace of a roll at the time of rolling. Moreover, a consideration is taken so as to keep such surface roughness thereof. The reflection mirror 204 is formed into a concave shape of substantially a paraboloid of revolution so that a reflection surface 204*a* has a solid angle of $2\pi$ steradian in relation to the LED element 202 and so that has the reflection surface 204*a* has a focal point at the position of the LED element 202. Accordingly, at the reflection mirror 204, all the light emitted from the LED element 202 becomes a reflected light that is parallel to an axis of the parabolic surface of revolution. Then, the light is radiated from the radiation portion 206 at the back of the LED element 202.

The LED element 202 is located at the center of the reflection mirror 204, so that the LED 201 has high light condensation/reflection efficiency and there is little axial dislocation. Since the aluminum reflection mirror 204 is used, the LED 201 can endure the process in the reflow furnace for surface mounting and be miniatured. Since it is encapsulated by the transfer mold, it is excellent in mass-productivity. Since it is only a light radiation surface 206 that needs to be formed as an optical surface, the LED 201 becomes an optical device that has more choices in the manufacturing method.

The one lead 203a is contacted with the reflection mirror 204 at three points. However, a lower surface of the other lead 203b is etched, so that a gap is formed between the other lead 203b and the reflection mirror 204, thereby providing insulation. Therefore, it is prevented that the one lead 203a and the other lead 203b are short-circuited via the reflection mirror 204.

Tenth Embodiment

Figure 31:
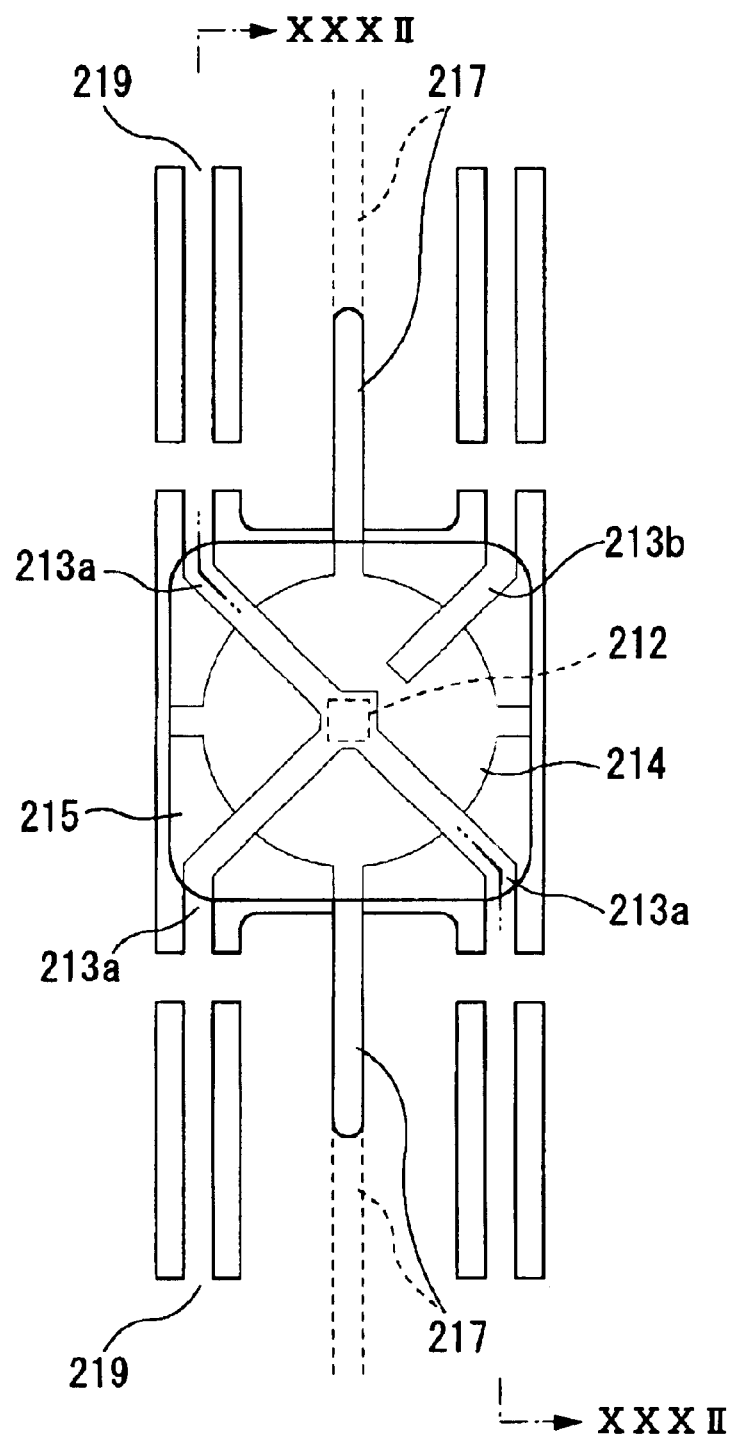
FIG. 31 is a plan view showing a manufacturing method of the reflective LED according to a tenth embodiment of the invention.
Figure 32:
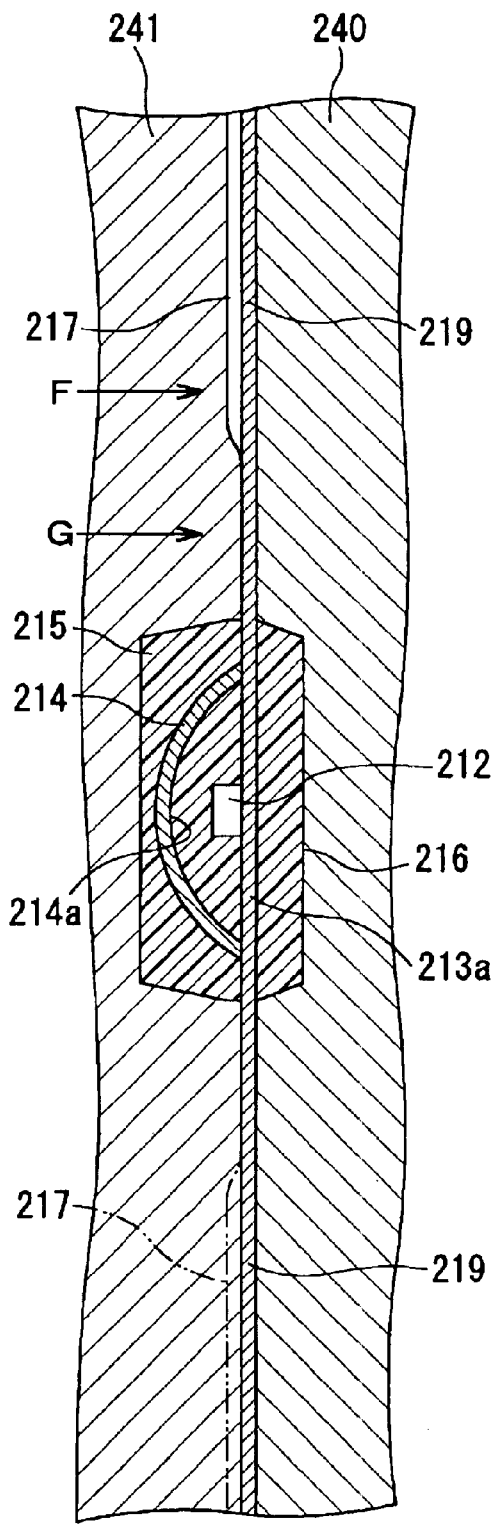
FIG. 32 is a cross-section taken along the line XXXII—XXXII of FIG. 31.

A tenth embodiment of the invention is described referring to FIG. 31 and FIG. 32. FIG. 31 is a plan view showing a manufacturing method of the reflective LED according to a tenth embodiment of the invention. FIG. 32 is a cross-section taken along the line XXXII—XXXII of FIG. 31.

As shown in FIG. 31 and FIG. 32, in a manufacturing method of a tenth embodiment of a reflective LED, a LED element 212 is mounted on a center of a lower surface of the one lead 213a in a pair of leads 213a and 213b for supplying an electric power to the LED element 212. A wire (not shown) bonds the other lead 213b and the LED element 212 to electrically connect them. A reflection mirror 214 is formed into a concave shape by pressing an aluminum plate. The reflection mirror 214 is placed on a lower mold via reflection mirror supports 217 that extend upward and downward. A lead frame 219 is laid over the reflection mirror 214. Then, a position of the lead frame 219 is adjusted such that the LED element 212 mounted on the lead 213a is located so as to face the center of the reflection mirror 214.

The tenth embodiment is different from the ninth embodiment in that the upper and lower reflection mirror supports 217 are bent at their middle positions toward the lead frame 219 so as to be fitted into openings formed on the lead frame 219, respectively. Thus, the reflection frame supports 217 are made flush with the lead frame 219. The reflection frame supports 217 and the lead frame 219 are held between the molds at such flush surface. Thus, it is prevented that the resin is leaked therefrom. A reflection member 230 and the lead frame 219 have the same thickness of 0.2 mm, respectively. There is no gap substantially between the openings of the lead frame 219 and the reflection mirror supports 217 fitted therein since they are crushed at the time of pressing.

Then, burrs are formed at trimmed hollow spaces of the lead frame 219 or the reflection member 230. The bur has a thickness corresponding to a thickness of the lead frame 209 or the reflection member 230. The tenth embodiment of the manufacturing method can lessen an amount of the burrs half as much as the ninth embodiment. A removing work of the burrs can be carried out simultaneously in a trimming form step of the lead frame 219. Since the thickness of the bur is 0.2 mm corresponding to the plate thickness of the lead frame 219 or reflection member 230, there is no possibility that a crack is generated on a resin package at the time of trimming the burrs. Since a height of a border of a reflection surface becomes a lead surface at a side where the LED element 212 is not mounted. Therefore, the reflection mirror 214 can have a large solid angle relative to the LED element 212. After the transfer molding, the leads 213a and 213b are cut away from the lead frame 219, and the upper and lower reflection mirror supports 217 are cut off at the end surface of the epoxy resin 215. Consequently, the tenth embodiment of the reflective LED is finished as a product.

The reflection mirror 214 uses an aluminum plate of 0.2 mm thick with a linear reflectance of 85% which is fabricated by such a working method as not to cause a trace of a roll at the time of rolling. Moreover, a consideration is taken so as to keep such surface roughness thereof. The reflection mirror 214 is formed into a concave shape of substantially a paraboloid of revolution so that a reflection surface 214a has a solid angle of $2\pi$ steradian in relation to the LED element 212 and so that has the reflection surface 214a has a focal point at the position of the LED element 212. Accordingly, at the reflection mirror 214, all the light emitted from the LED element 212 becomes a reflected light that is parallel to an axis of the parabolic surface of revolution. Then, the light is radiated from a radiation portion 216 at the back of the LED element 212.

The LED element 212 is located at the center of the reflection mirror 214, so that the LED 211 has high light condensation/reflection efficiency and there is little axial dislocation. Since the aluminum reflection mirror 214 is used, the LED 211 can endure the process in the reflow furnace for surface mounting and be miniatured. Since it is encapsulated by the transfer mold, it is excellent in mass-productivity. Since it is only a light radiation surface 216 that needs to be formed as an optical surface, the LED 211 becomes an optical device that has more choices in the manufacturing method.

Though not shown, the border of the reflection mirror 214 is cut away so as to form a gap between the lead 213b and the reflection mirror 214 for insulation. Therefore, the one lead 213a and the other lead 213b are not short-circuited via the reflection mirror 214.

Eleventh Embodiment

Figure 33:
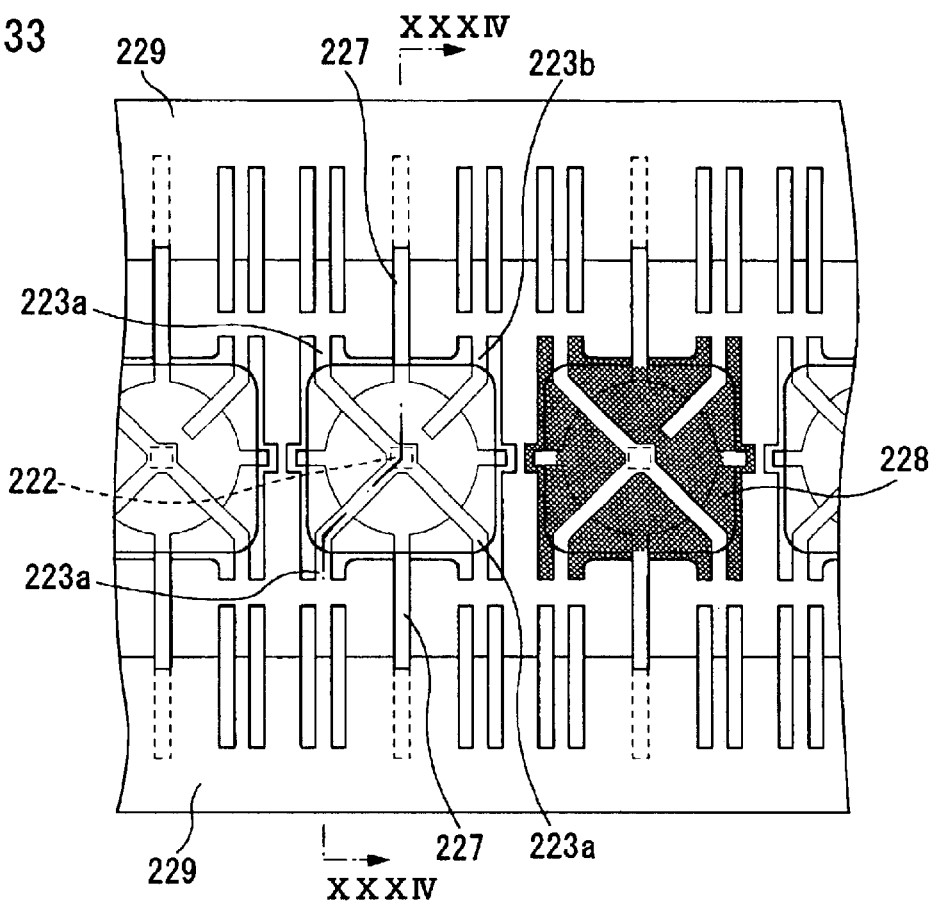
FIG. 33 is a plan view showing a manufacturing method of the reflective LED according to an eleventh embodiment of the invention.
Figure 34:
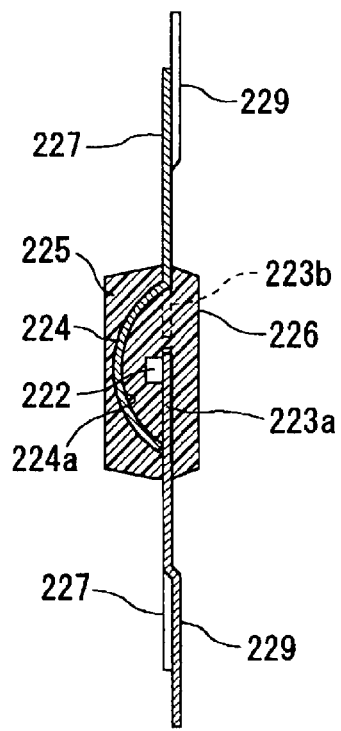
FIG. 34 is a cross-section taken along the line XXXIV—XXXIV of FIG. 33.
Figure 35:
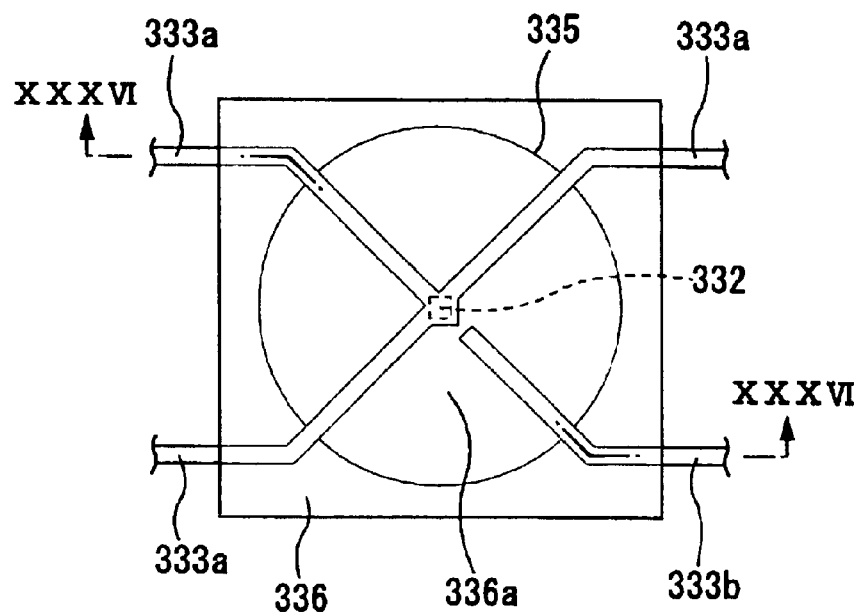
FIG. 35 is a plan view showing an overall construction of a conventional reflective LED.
Figure 36:
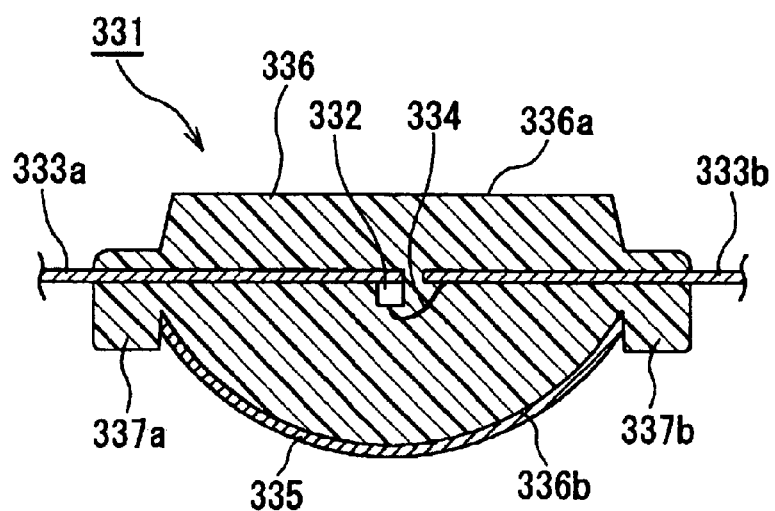
FIG. 36 is a cross-section taken along the line XXXVI—XXXVI of FIG. 35.

An eleventh embodiment of the invention is described referring to FIG. 33 and FIG. 34. FIG. 33 is a plan view showing a manufacturing method of the reflective LED according to an eleventh embodiment of the invention. FIG. 34 is a cross-section taken along the line XXXIV—XXXIV of FIG. 33.

As shown in FIG. 33 and FIG. 34, in a manufacturing method of an eleventh embodiment of a reflective LED, a LED element 222 is mounted on a lower surface of one lead 223a in a pair of leads 223a and 223b for supplying an electric power to the LED element 222. A wire (not shown) bonds the other lead 223b and the LED element 222 to electrically connect them. A reflection mirror 224 is formed into a concave shape by pressing an aluminum plate. The reflection mirror 224 is placed on a lower mold via reflection mirror supports 227 that extend upward and downward. A lead frame 229 is laid over the reflection mirror 224. Then, a position of the lead frame 229 is adjusted such that the LED element 222 mounted on the lead 223a is located so as to face the center of the reflection mirror 224 of concave shape.

Contrary to the tenth embodiment, the lead frame 229 is bent at its middle position toward the upper and lower reflection mirror supports 227 so that the mirror supports 227 are fitted into openings formed on the lead frame 229, respectively. Thus, the reflection frame supports 227 are made flush with the lead frame 229. A shape of a metal mold is the same as that of the tenth embodiment. In the same way as the ninth embodiment, the reflection member border portion, the lead frame border portion and the metal mold prevent a leakage of an encapsulating resin. Specifically, the metal mold has such a dimension and design as to clamp an overlapped area of the reflection member border portion and the lead frame border portion prior to an area where they are made flush. Consequently, burrs are formed at trimmed hollow spaces of the lead frame 229 or a reflection member 230. The bur has a thickness corresponding to a thickness of the lead frame 229 or the reflection member 230. The eleventh embodiment of the manufacturing method can lessen an amount of the burrs half as much as the ninth embodiment. A removing work of the burrs can be carried out simultaneously in a trimming form step of the lead frame 229. Since the thickness of the bur is 0.2 mm corresponding to the plate thickness of the lead frame 229 or reflection member 230, there is no possibility that a crack is generated on a resin package at the time of trimming the burrs. Since a height of a border of a reflection surface becomes a lead surface at a side where the LED element 222 is not mounted. Therefore, the reflection mirror 224 can have a large solid angle relative to the LED element 222.

After the transfer molding, the leads 223a and 223b are cut away from the lead frame 229, and the upper and lower reflection mirror supports 227 are cut off at the end surface of a transparent epoxy resin 225. Consequently, the eleventh embodiment of the reflective LED is finished as a product.

The reflection mirror 224 uses an aluminum plate of 0.2 mm thick with a linear reflectance of 85% which is fabricated by such a working method as not to cause a trace of a roll at the time of rolling. Moreover, a consideration is taken so as to keep such surface roughness thereof. The reflection mirror 224 is formed into a concave shape of substantially a paraboloid of revolution so that a reflection surface 224a has a solid angle of $2\pi$ steradian in relation to the LED element 222 and so that has the reflection surface 224a has a focal point at the position of the LED element 222. Accordingly, at the reflection mirror 224, all the light emitted from the LED element 222 becomes a reflected light that is parallel to an axis of the parabolic surface of revolution. Then, the light is radiated from a radiation portion 226 at the back of the LED element 222.

The LED element 222 is located at the center of the reflection mirror 224, so that the LED 221 has high light condensation/reflection efficiency and there is little axial dislocation. Since the aluminum reflection mirror 224 is used, the LED 221 can endure the process in the reflow furnace for surface mounting and be miniatured. Since it is encapsulated by the transfer mold, it is excellent in mass-productivity. Since it is only a light radiation surface 226 that needs to be formed as an optical surface, the LED 221 becomes an optical device that has more choices in the manufacturing method.

The one lead 223a is contacted with the reflection mirror 224 at three points. However, a lower surface of the other lead 223b is etched at the border of the reflection mirror 224, so that a gap is formed between the other lead 223b and the reflection mirror 224, thereby providing insulation. Therefore, it is prevented that the one lead 223a and the other lead 223b are short-circuited via the reflection mirror 224.

As shown in FIG. 33, in an actual manufacturing method, the same structure as the lead frame 229 is successively arranged in a longitudinal direction. The reflection mirrors 224 with the upper and lower mirror supports 227 are overlapped with the leads 223a and 223b, respectively. Then, plural transfer moldings are carried out at once by use of metal molds successively arrange in a longitudinal direction. So it is in the tenth and eleventh embodiments. At the time of transfer molding, the epoxy resin 224 flows into an area shown by hatching 228 in FIG. 33. Though part of the leads 223a and 223b are shown without the hatching, they are encapsulated by the epoxy resin 225 as a matter of course.

Each of the above-mentioned manufacturing methods is applicable suitable as a manufacturing method of the reflective LEDs according to the first and second embodiments (FIG. 1 to FIG. 7).

While each of the above embodiments describes the reflective LED as one example of the reflective optical device, they may be embodied into a reflective PD, a reflective PT or an optical device having both a light emitting element and a photodetector. Particularly, if the LED element is substituted with the photodetector, the embodiment can be used as the reflective PD or the reflective PT as such.

While each of the above-mentioned embodiments forms the reflection surface of the reflection mirror into substantially a paraboloid of revolution, the shape of the reflection surface of the reflection mirror is not limited thereto. It may be a variety of shapes, e.g., a hemispherical shape, a semi-ellipsoidal shape of revolution or the like, according to requirements of light radiation property such as light distribution property. At this time, it is easy to manufacture a product having a different specification of light distribution only by changing a punch for forming the reflection surface.

While each of the above-mentioned embodiments uses the transparent epoxy resin as a light transmitting material for encapsulation, other kinds of encapsulating materials (light transmitting materials) may be used such as a transparent silicon resin. While each of the above-mentioned embodiments uses the copper alloy plate with the silver plating as the leads, a variety of materials can be used instead, such as a steel plate with a silver plating, a copper plate with an aluminum vapor-deposition.

In each of the above-mentioned embodiments, the reflection mirror as the reflection member uses the aluminum plate with a linear reflectance of 85% which is fabricated by such a working method as not to cause a trace of a roll at the time of rolling. However, the reflectance may be less than that. Still, the reflection mirror used for such kind of optical control needs such a surface roughness as to get a high linear reflectance. Specifically, the reflective structure is meaningless if it cannot control an optical control and converge the light effectively. Particularly, in case the reflection mirror is encapsulated by the resin, there is a refraction at an interface when the light inside the resin is radiated outward from the interface of the resin. Therefore, a scattering factor of the light that has been scattered at the reflection mirror is heightened more at the time of refraction at the interface. Consequently, a reflection mirror fabricated only by punching a common aluminum plate is not suitable as the reflection mirror to be used in the invention. As a specific lower limit, the linear reflectance is preferably not less than 65%. The LED of reflective structure can radiate outwardly the parallel light about three times as much as the lens LED. Therefore, the reflective LED can obtain a sufficiently superior property if the linear reflectance is not less than 65%, even in consideration of the refraction. In this case, the linear reflectance is a value for the light emitted from the LED element.

The reflection mirror may be an aluminum plate that improves the linear reflectance by coining or a metal plate with a silver plating or made of a material other than the metal. While each of the above embodiments uses the metal for the reflection member, it may use a mirror-finished resin or ceramics or glass, etc. In case the reflection mirror is made of the resin, it is necessary to take into account a deformation of a reflection surface due to heating at the time of encapsulation. In case of the reflection mirror is made of the ceramics, a consideration is necessary so that the ceramics do not hurt leads or fixed parts on a machine at the time of fixing the ceramics on the lead.

While, in each of the above-mentioned embodiments, the lower surface of the other lead is half-etched so as to be insulated from the reflection mirror, both the leads may be etched instead. Moreover, the insulation can be obtained by pressing work such as punching other than the etching.

The structure, shape, number or amount, material, dimension, connecting relation or the like of the other parts of the reflective optical device and the other steps of the manufacturing method of the reflective optical device are not limited to those of the above embodiments.

The preferred embodiments described herein are illustrative and not restrictive, the scope of the invention being indicated in the appended claims and all variations which come within the meaning of the claims are intended to be embraced therein.

What is claimed is:

1. A reflective light emitting diode (LED) comprising:
   an LED element;
   a pair of leads for supplying an electric power to the LED element;
   a reflection mirror of concave shape facing a light emitting side of the LED element; and
   a radiation portion provided at a back side of the LED element;
   the LED element being mounted on one of the leads and the one of the leads being contacted with or disposed near the reflection mirror;
   one of the leads being insulated from the reflection mirror; and
   the pair of the leads and the reflection mirror being made of a material having a high heat conductivity, respectively, so as to have a sufficient heat capacity for diffusing heat radiated from the LED element.

2. A reflective LED according to claim 1, further comprising a light transmitting material for encapsulation, the light transmitting material encapsulating the LED element, part of the pair of the leads and the reflection mirror by molding so as to form a reflection portion.

3. A reflective LED according to claim 1, further comprising a heat-conducting portion formed at a border portion of the reflection mirror so as to conduct heat from the one of the leads.

4. A reflective LED according to claim 3, in which the heat-conducting portion comprises a flat marginal portion of a ring shape integrally formed along an outer circumferential edge of the reflection mirror so as to protrude outward in a flange shape.

5. A reflective LED according to claim 4:
   in which the pair of the leads are disposed near the reflection mirror;
   the reflective LED further comprising an insulating sheet material having a ring shape corresponding to the flat marginal portion of the reflection mirror and interposed between the pair of the leads and the flat marginal portion of the reflection mirror so as to insulate the pair of the leads and the reflection mirror, respectively.

6. A reflective LED according to claim 3, in which the heat-conducting portion comprises protrusions of a flat plate shape protruding outward only from positions corresponding to the leads in an outer circumferential edge of the reflection mirror.

7. A reflective LED according to claim 1, in which the pair of the leads and the reflection mirror are made of a metal plate, respectively.

8. A reflective LED according to claim 1, in which the reflection mirror is made of an aluminum plate.

9. A reflective LED according to claim 1 in which:
   the one of the leads is contacted with the reflection mirror; and
   the other of the leads is disposed away from the reflection mirror via one of a cut-away portion formed at a position of the reflection mirror facing the other of the leads, a dent formed at a position of the reflection mirror facing the other of the leads and a bridging portion formed at a position of the reflection mirror facing the other of the leads, so that the other of the leads is insulated from the reflection mirror.

10. A reflective LED according to claim 1 in which the reflection mirror has a light transmitting insulating treatment provided on a surface and the pair of the leads are contacted with the reflection mirror.

11. A reflective LED according to claim 10 in which:
    the pair of the leads are contacted with an outer circumferential edge of the reflection mirror;
    the radiation portion is made of a glass plate covering an entire opening of the reflection mirror from an outside of the pair of the leads;
    the reflection mirror has hooking claws at the outer circumferential edge so as to hook an outer surface of an outer circumferential edge portion of the reflection mirror through the hooking claws, thereby holding and assembling the pair of the leads between the outer circumferential edge and the glass plate.

12. A reflective LED according to claim 1 in which:
    the reflection mirror has a reflection surface formed on an alumina and a reflection layer vapor-deposited on the reflection surface so as to have a hollow inside space;
    the reflection mirror has recesses formed on an outer circumference for accommodating the pair of the leads; and
    the pair of the leads are fitted in the recesses of the reflection mirror, respectively, and at least the one of the leads is contacted with the reflection mirror via a dent.

13. A reflective optical device comprising:
    a solid-state optical element, a lead, an encapsulating material and a reflection member;
    the solid-state optical element being mounted on the lead;
    the reflection member having a reflection mirror formed thereon, and the reflection mirror being disposed at a position facing the solid-state optical element;
    the encapsulating material encapsulating the solid-state optical element, part of the lead and the reflection mirror so that a light radiation surface and/or a light incident surface is formed at a back of the solid-state optical element; and
    the lead being extracted from one side of the encapsulating material to define an external terminal.

14. A reflective optical device according to claim 13, in which the reflection member is made of a metal.

15. A reflective optical device according to claim 13, in which the reflection member is made of a metal plate.

16. A reflective optical device according to claim 13, in which the reflection mirror is made only of the reflection member itself.

17. A reflective optical device according to claim 13, in which the reflection mirror of the reflection member has a linear reflectance of about 65% or more.

18. A reflective optical device according to claim 13, in which the lead is extracted to a side of the encapsulating material facing a side surface of the solid-state optical element.

19. A reflective optical device according to claim 13, in which the lead is extracted to a side of the encapsulating material facing a back surface of the solid-state optical element.

20. A reflective optical device according to claim 13, in which:
the reflection member has a reflection member support at a leading end side that is an opposite side to an extracting side of the lead, the reflection member being connected to the reflection member to support the reflection member; and
a leading end side of the lead being extended so as to overlap with the reflection member support, the leading end side of the lead and the reflection member support being tightly contacted and encapsulated by the encapsulating material.

21. A manufacturing method of a reflective optical device, comprising the steps of:
fixing a lead frame and a reflection member in a fixed positional relationship, the lead frame having a lead while the lead having a solid-state optical element mounted thereon, and the reflection member having a reflection mirror; and
encapsulating the solid-state optical element, the reflection mirror and part of the lead frame in a concave mold by filling the concave mold with an encapsulating material, while molding an optical radiation surface and/or optical incident surface at a back side of the solid-state optical element.

22. A manufacturing method of a reflective optical device according to claim 21, in which:
a multiplicity of the leads are successively formed on the lead frame;
a multiplicity of the reflection mirrors are successively formed on the reflection member; and
the solid-state optical element is mounted on each of the leads.

23. A manufacturing method of a reflective optical device according to claim 21, in which the reflection member has a reflection member support at a leading end, a leading end side of the lead is extended so as to be overlap with the reflection member support, and an inside shape of the mold is tapered toward the leading end of the mold.

24. A manufacturing method of a reflective optical device:
the reflective optical device comprising a solid-state optical element, a lead, an encapsulating material and a reflection member;
the manufacturing method comprising the steps of:
mounting the solid-state optical element on the lead;
laying a lead frame supporting the lead and the reflection member having the reflection mirror on each other so that at least part of the lead frame around a portion of the lead on which the solid-state optical element is mounted and at least part of the reflection member around the reflection mirror are overlapped with each other and so that an overlapped part reaches a surrounding of the reflection mirror about the reflection mirror; and
holding at least part of the overlapped portion of the lead frame and the reflection member between a pair of molds so as to dispose the reflection mirror and the lead in a cavity formed in the molds, thereby encapsulating the reflection mirror and the lead by an encapsulating material.

25. A manufacturing method of a reflective optical device, comprising the steps of:
mounting a solid-state optical element on a lead;
mounting the lead supported on a lead frame on a reflection mirror provided on a reflection member so that the solid-state optical element faces the reflection mirror; and
holding the reflection member and the lead frame in a metal mold and encapsulating the reflection member and the lead frame by an encapsulating resin after deforming a reflection mirror support, which is provided on the reflection member so as to extend outward from the reflection mirror, at a middle position thereof to a same height as the lead so that a portion of the reflection member corresponding to the reflection mirror is disposed within a thickness of a portion of the lead frame corresponding to the reflection mirror.

26. A manufacturing method of a reflective optical device, comprising the steps of:
mounting a solid-state optical element on a lead;
mounting the lead supported on a lead frame on a reflection mirror provided on a reflection member so that the solid-state optical element faces the reflection mirror; and
encapsulating the reflection member and the lead frame by an encapsulating resin after deforming the lead to a same height as a reflection mirror support, which is provided on the reflection member so as to extend outward from the reflection mirror, so that a portion of the lead frame corresponding to the reflection mirror is disposed within a thickness of a portion of the reflection member corresponding to the reflection mirror.

27. A reflective optical device comprising:
a solid-state optical element, a lead, an encapsulating material and a reflection mirror;
the solid-state optical element being mounted on the lead;
the reflection member having a reflection mirror formed thereon, and the reflection mirror being disposed at a position facing the solid-state optical element;
the reflection mirror having a border portion disposed within a height of a rear surface of the lead from a surface of the lead on which the solid-state optical element is mounted;
the encapsulating material encapsulating the solid-state optical element and the reflection mirror so as to form a light radiation surface and/or a light incident surface at a back of the solid-state optical element.

* * * * *